(12) United States Patent
Toda

(10) Patent No.: US 10,074,682 B2
(45) Date of Patent: Sep. 11, 2018

(54) PHASE DIFFERENCE DETECTION IN PIXELS

(71) Applicant: SONY CORPORATION, Tokyo (JP)

(72) Inventor: Atsushi Toda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 18 days.

(21) Appl. No.: 14/915,902

(22) PCT Filed: Jun. 23, 2015

(86) PCT No.: PCT/JP2015/067979
§ 371 (c)(1),
(2) Date: Mar. 2, 2016

(87) PCT Pub. No.: WO2016/002574
PCT Pub. Date: Jan. 7, 2016

(65) Prior Publication Data
US 2017/0170222 A1    Jun. 15, 2017

(30) Foreign Application Priority Data

Jul. 3, 2014  (JP) .................................. 2014-137436

(51) Int. Cl.
*H01L 27/146* (2006.01)
*H04N 5/374* (2011.01)
*H04N 5/378* (2011.01)

(52) U.S. Cl.
CPC .. *H01L 27/14627* (2013.01); *H01L 27/14605* (2013.01); *H01L 27/14621* (2013.01); *H01L 27/14634* (2013.01); *H01L 27/14645* (2013.01); *H04N 5/374* (2013.01); *H04N 5/378* (2013.01)

(58) Field of Classification Search
CPC ......... H01L 27/14627; H01L 27/14645; H01L 27/14605; H01L 27/14621; H01L 27/14634; H01L 27/146; H04N 5/374; H04N 5/378; G02B 7/34
See application file for complete search history.

(56) References Cited

U.S. PATENT DOCUMENTS

| | | | |
|---|---|---|---|
| 2008/0174689 A1* | 7/2008 | Furukawa | H01L 27/14627 348/340 |
| 2009/0020690 A1* | 1/2009 | Toda | G02B 5/188 250/227.2 |

(Continued)

FOREIGN PATENT DOCUMENTS

| JP | 2007-158109 A | 6/2007 |
|---|---|---|
| JP | 2008-053366 A | 3/2008 |
| JP | 2009-015315 A | 1/2009 |

(Continued)

*Primary Examiner* — Thanh T Nguyen
(74) *Attorney, Agent, or Firm* — Chip Law Group

(57) ABSTRACT

The present disclosure relates to a solid-state imaging device that can perform phase difference detection at a high sensitivity even in fine pixels, and an electronic apparatus.

Pixels of the solid-state imaging device share one on-chip lens, and the pixels each have an in-layer lens below the on-chip lens. The present disclosure can be applied to various kinds of electronic apparatuses, such as solid-state imaging devices, imaging apparatuses like digital still cameras and digital video cameras, portable telephone devices having imaging functions, and audio players having imaging functions.

24 Claims, 28 Drawing Sheets

(56) References Cited

U.S. PATENT DOCUMENTS

| | | | | |
|---|---|---|---|---|
| 2010/0201834 | A1* | 8/2010 | Maruyama | H01L 27/1464 348/222.1 |
| 2015/0236066 | A1* | 8/2015 | Tayanaka | H01L 27/14627 257/432 |

FOREIGN PATENT DOCUMENTS

| | | | |
|---|---|---|---|
| JP | 2009-109965 | A | 5/2009 |
| JP | 2013-004635 | A | 1/2013 |
| JP | 2013-041890 | A | 2/2013 |
| JP | 2013-210507 | A | 10/2013 |
| JP | 2014-075445 | A | 4/2014 |
| JP | 2014-154755 | A | 8/2014 |
| JP | 2014-165907 | A | 9/2014 |
| JP | 2014165907 | A * | 9/2014 |

* cited by examiner

PHASE DIFFERENCE DETECTION IN PIXELS

TECHNICAL FIELD

The present disclosure relates to a solid-state imaging device and an electronic apparatus, and more particularly, to a solid-state imaging device that can perform phase difference detection at a high sensitivity even in fine pixels, and an electronic apparatus.

BACKGROUND ART

In a solid-state imaging device, phase difference pixels are provided as some of the pixels two-dimensionally arranged in a matrix fashion, and focus detection is performed by a known imaging surface phase difference technique.

The right half or the left half of each phase difference pixel is covered with a light shielding film, and the imaging surface phase difference technique is a technique of detecting a phase difference on an imaging surface between a phase difference pixel that receives light at its right half and a phase difference pixel that receives light at its left half (see Patent Document 1, for example).

In this case, the sensitivity of the phase difference pixels is severely degraded due to a decrease in aperture ratio. Therefore, the phase difference pixels as pixels for generating images become defective pixels, and cannot contribute to signals as images. As a result, image resolution degradation and false color generation are caused due to the influence of the defective pixels. Particularly, in a phase difference pixel as a fine pixel of 1.5 μm or smaller, the aperture size is reduced to ½ of the wavelength Δ. Because of the principles of cutoff frequencies of waveguides, the long wavelength side of incident light is cut off, and sensitivity is severely degraded (the cutoff condition is λ≥2a, where "a" represents the aperture size). This means that a rapid drop in sensitivity is accompanied by degradation in focusing accuracy, particularly in dark places.

To counter this, there is a technique by which a photodiode (PD) is divided into two parts in a pixel, and a phase difference is detected without any light shielding film (see Patent Document 2, for example). In this case, signals from the divided PDs are combined and are used as an image signal. Accordingly, phase difference pixels do not become defective pixels, and sensitivity degradation is prevented.

However, the number of read transistors increases as the PDs are divided. Therefore, manufacturing of fine pixels, or particularly, fine pixels of 1.5 μm and smaller, becomes difficult, because of the structures of those pixels. Also, the decrease in the capacity of each PD has adverse influence such as rapid saturation of the PDs.

For the above reasons, it is safe to say that the light shielding film technique using light shielding films and the PD dividing technique using divided PDs are not suitable for fine pixels.

Meanwhile, there is a technique by which a large on-chip lens (OCL) is formed for more than one pixel, and a phase difference is detected with signals generated from the pixels sharing the OCL (see Patent Document 3, for example).

CITATION LIST

Patent Documents

Patent Document 1: Japanese Patent Application Laid-Open No. 2009-109965

Patent Document 2: Japanese Patent Application Laid-Open No. 2013-41890

Patent Document 3: Japanese Patent Application Laid-Open No. 2013-210507

SUMMARY OF THE INVENTION

Problems to be Solved by the Invention

The technique disclosed in Patent Document 3 can be applied to fine pixels. However, the OCL condenses incident light between pixels that have no photoelectric conversion units provided therein. In a case where one OCL is provided for four pixels, for example, incident light is condensed in a portion near the point of intersection between the boundary lines among the four pixels. In a case where one OCL is provided for two pixels, incident light is condensed in a portion near the center of the boundary line between the two pixels. Therefore, the technique disclosed in Patent Document 3 results in sensitivity degradation.

The present disclosure is made in view of those circumstances, and is to enable high-sensitivity phase difference detection in fine pixels.

Solutions to Problems

In a solid-state imaging device of a first aspect of the present disclosure, pixels share one on-chip lens, and the pixels each have an in-layer lens below the on-chip lens.

An electronic apparatus of a second aspect of the present disclosure include a solid-state imaging device that include pixels sharing one on-chip lens, the pixels each having an in-layer lens below the on-chip lens.

In the first and second aspects of the present disclosure, pixels share one on-chip lens, and the pixels each have an in-layer lens below the on-chip lens.

A solid-state imaging device of a third aspect of the present disclosure includes: a first semiconductor region; a second semiconductor region; a first color filter provided above the first semiconductor region; a second color filter provided above the second semiconductor region; an on-chip lens provided above the first color filter and the second color filter; a first lens provided between the first semiconductor region and the on-chip lens in a cross-sectional direction; and a second lens provided between the second semiconductor region and the on-chip lens in the cross-sectional direction.

In the third aspect of the present disclosure, the first color filter is provided above the first semiconductor region, the second color filter is provided above the second semiconductor region, the on-chip lens is provided above the first color filter and the second color filter, the first lens is provided between the first semiconductor region and the on-chip lens in the cross-sectional direction, and the second lens is provided between the second semiconductor region and the on-chip lens in the cross-sectional direction.

The solid-state imaging device and the electronic apparatus may be independent devices, or may be modules to be incorporated into other devices.

Effects of the Invention

According to the first and second aspects of the present disclosure, phase difference detection can be performed at a high sensitivity even in fine pixels.

It should be noted that effects of the present technology are not limited to the effect described above, and may include any of the effects described in the present disclosure.

BRIEF DESCRIPTION OF DRAWINGS

FIG. 12 is a diagram showing a pixel structure of phase difference pixels disclosed in Patent Document 1 and the like.

FIG. 13 is a diagram showing a pixel structure of phase difference pixels disclosed in Patent Document 3 and the like.

MODES FOR CARRYING OUT THE INVENTION

The following is a description of modes (hereinafter referred to as embodiments) for carrying out the present disclosure. Explanation will be made in the following order.

1. First embodiment (an example structure having in-layer lenses below color filters)

2. Second embodiment (an example structure having in-layer lenses above color filters)

3. Third embodiment (an example structure further including a protection film)

4. Fourth embodiment (an example structure further including waveguides)

5. Fifth embodiment (an example structure having photoelectric conversion units outside the semiconductor substrate)

6. Sixth embodiment (an example structure having photoelectric conversion units and a protection film outside the semiconductor substrate)

7. Seventh embodiment (an example structure in which each one pixel receives R, G, and B light)

8. Application of exit pupil correction

9. Other examples of color filters and OCLs

10. Example structure of a back-illuminated type

11. Example structure of the substrate of a solid-state imaging device

12. Example application to electronic apparatuses

<1. First Embodiment>

<Outline of an Example Structure of a Solid-State Imaging Device>

Figure 1:
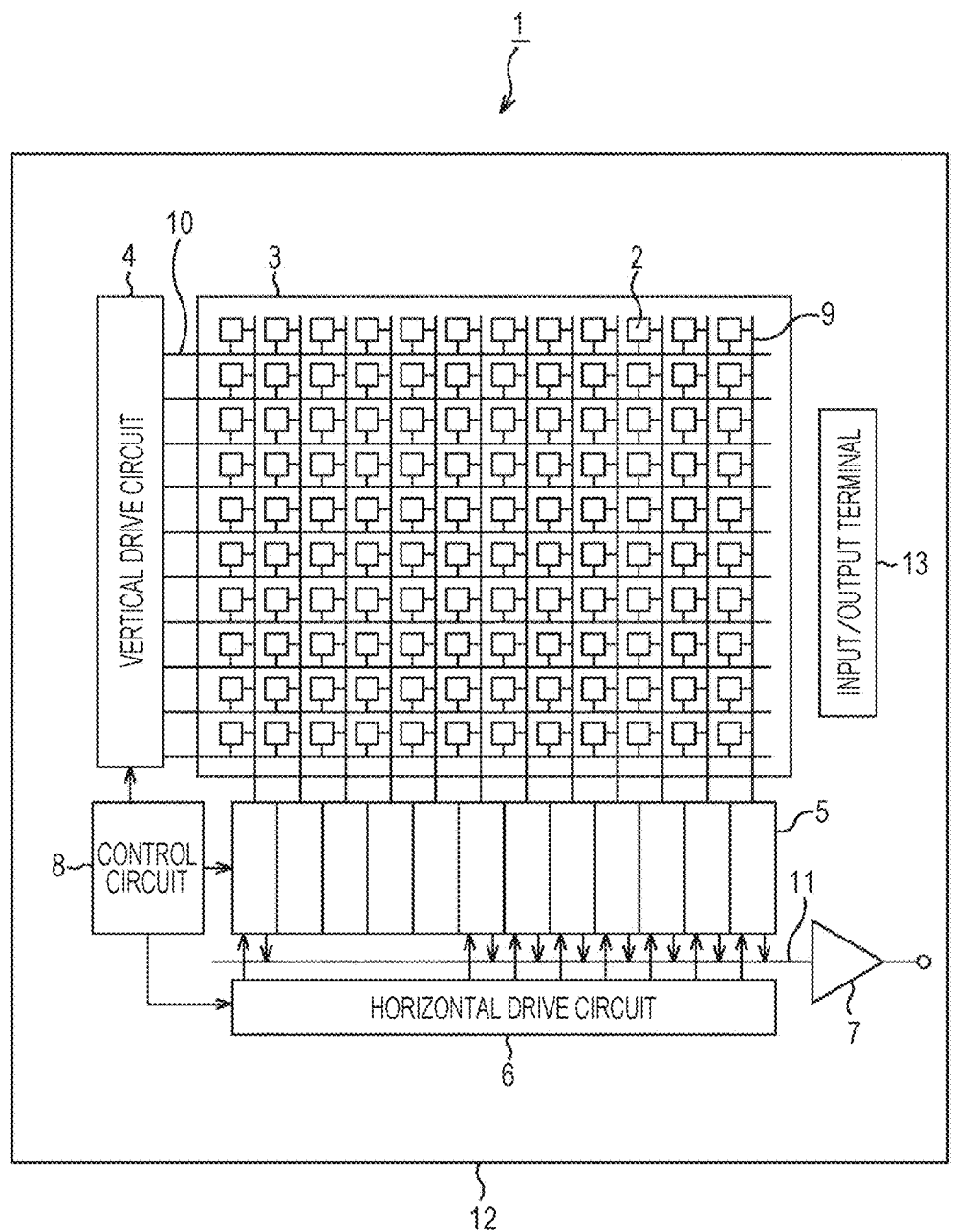
FIG. 1 is a diagram schematically showing the structure of a solid-state imaging device according to the present disclosure.

FIG. 1 schematically shows the structure of a solid-state imaging device according to the present disclosure.

The solid-state imaging device 1 shown in FIG. 1 includes a pixel array unit 3 having pixels 2 arranged in a two-dimensional array on a semiconductor substrate 12 using silicon (Si) as the semiconductor, for example, and a peripheral circuit unit existing around the pixel array unit 3. The peripheral circuit unit includes a vertical drive circuit 4, column signal processing circuits 5, a horizontal drive circuit 6, an output circuit 7, a control circuit 8, and the like.

The pixels 2 each include a photoelectric conversion unit formed with a photodiode, for example, and pixel transistors. The pixel transistors are formed with the four MOS transistors: a transfer transistor, a select transistor, a reset transistor, and an amplifying transistor, for example. The transfer transistor might not be provided in a case where the photoelectric conversion unit is provided as a photoelectric conversion film outside the semiconductor substrate 12, for example.

Also, the pixels 2 may be a sharing pixel structure. The pixel sharing structure includes photoelectric conversion units, transfer transistors, one shared floating diffusion (a floating diffusion region), and shared each one of other pixel transistors. That is, in the sharing pixel structure, the photoelectric conversion units and the transfer transistors that form unit pixels share each one of the other pixel transistors.

The control circuit 8 receives an input clock and data that designates an operation mode and the like, and also outputs data such as internal information about the solid-state imaging device 1. That is, based on a vertical synchronization signal, a horizontal synchronization signal, and a master clock, the control circuit 8 generates a clock signal and a control signal that serve as the references for operation of the vertical drive circuit 4, the column signal processing circuits 5, the horizontal drive circuit 6, and the like. The control circuit 8 then outputs the generated clock signal and control signal to the vertical drive circuit 4, the column signal processing circuits 5, the horizontal drive circuit 6, and the like.

The vertical drive circuit 4 is formed with a shift register, for example, selects a predetermined pixel drive line 10, supplies a pulse for driving the pixels 2 connected to the selected pixel drive line 10, and drives the pixels 2 on a row-by-row basis. That is, the vertical drive circuit 4 sequentially selects and scans the respective pixels 2 of the pixel array unit 3 on a row-by-row basis in the vertical direction, and supplies pixel signals based on signal charges generated in accordance with the amounts of light received in the photoelectric conversion units of the respective pixels 2, to the column signal processing circuits 5 through vertical signal lines 9.

The column signal processing circuits 5 are provided for the respective columns of the pixels 2, and performs signal processing such as denoising, on a column-by-column basis, on signals that are output from the pixels 2 of one row. For example, the column signal processing circuits 5 perform signal processing such as Correlated Double Sampling (CDS) for removing fixed pattern noise inherent to pixels and AD conversion.

The horizontal drive circuit 6 is formed with a shift register, for example, sequentially selects the respective column signal processing circuits 5 by sequentially outputting horizontal scan pulses, and causes the respective column signal processing circuits 5 to output pixel signals to a horizontal signal line 11.

The output circuit 7 performs signal processing on signals sequentially supplied from the respective column signal processing circuits 5 through the horizontal signal line 11, and outputs the processed signals. The output circuit 7 might perform only buffering, or might perform black level control, column variation correction, and various kinds of digital signal processing, for example. An input/output terminal 13 exchanges signals with the outside.

The solid-state imaging device 1 having the above structure is a so-called column AD type CMOS image sensor in which the column signal processing circuits 5 that perform CDS and AD conversion are provided for the respective pixel columns.

<Example Arrangement of Color Filters and OCLs>

Figure 2:
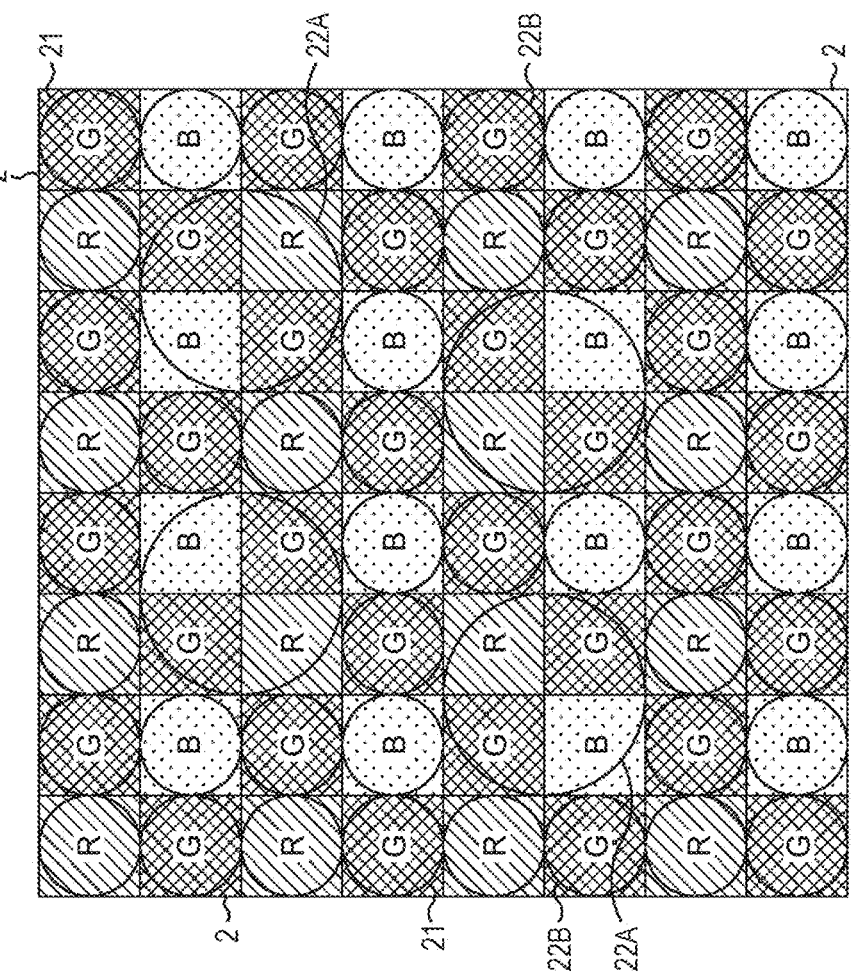
FIG. 2 is a top view of an example arrangement of color filters and OCLs.

FIG. 2 shows an example arrangement of the color filters and on-chip lenses (OCLs) formed on the respective pixels 2 of the solid-state imaging device 1.

In the solid-state imaging device 1, the respective color filters 21 of red (R), green (G), and blue (B) are arranged in a predetermined arrangement manner or in the Bayer pattern as shown in FIG. 2. The manner of arranging the respective color filters 21 of R, G, and B may be an arrangement manner other than the Bayer pattern. As will be described later, the colors of the color filters 21 may also include a color other than R, G, and B, or may be replaced with other colors. That is, in the solid-state imaging device 1 of the present disclosure, the colors and the arrangement of the color filters 21 can be arbitrarily determined.

Also, in the solid-state imaging device 1, as shown in FIG. 2, each OCL 22A is formed for four pixels consisting of 2×2 pixels aligned in the vertical direction and the horizontal direction, and is located in a predetermined position in the pixel array unit 3. As for the other pixels 2, an OCL 22B is formed on each pixel.

In the description below, the pixels 2 sharing one OCL 22A will be also referred to as the phase difference pixels 2A, and the pixels 2 each having one OCL 22B thereon will be also referred to as the normal pixels 2B.

<Cross-Sectional Structural View of Pixels According to a First Embodiment>

Figure 3:
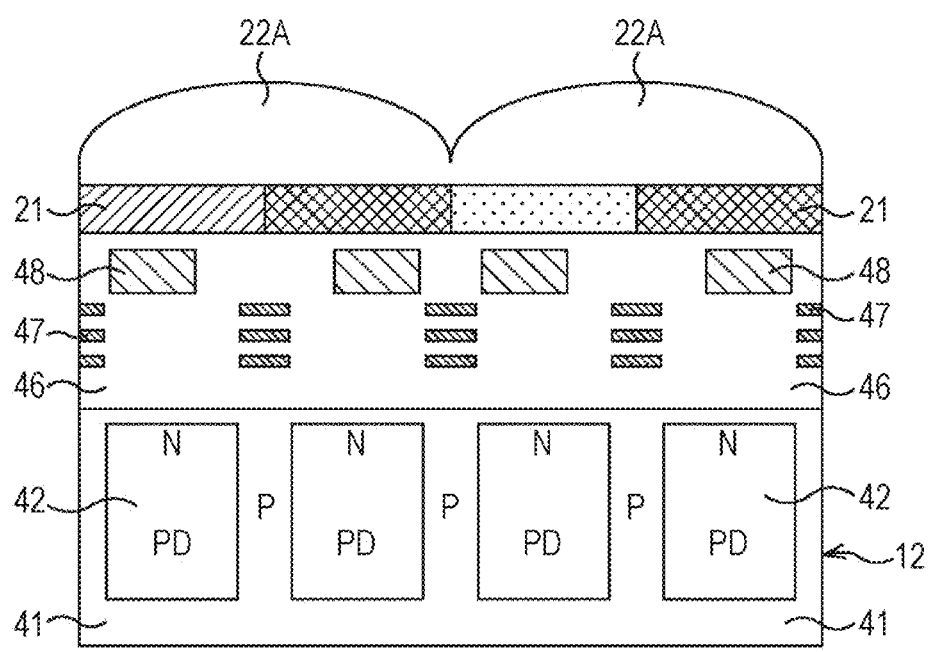
FIG. 3 is a cross-sectional structural view of phase difference pixels according to a first embodiment.

FIG. 3 is a cross-sectional structural view of phase difference pixels 2A according to a first embodiment.

In FIG. 2, two OCLs 22A are formed adjacent to each other, and a cross-section structure of four phase difference pixels 2A is shown.

In the solid-state imaging device 1, N-type (the second conductivity type) semiconductor regions 42 are formed for the respective pixels 2 in a P-type (the first conductivity type) semiconductor region 41 of the semiconductor substrate 12, for example, so that photodiodes PD are formed for the respective pixels. The P-type semiconductor region 41 existing on both the front and back surfaces of the semiconductor substrate 12 also serves as a hole charge storage region for restraining dark current.

An insulating layer 46 of a predetermined thickness is formed on the upper surface of the semiconductor substrate 12, and interconnect layers 47 are stacked in the insulating layer 46 at the pixel boundaries that do not prevent the photodiodes PD from receiving light. The interconnect layers 47 also have the function of light shielding films that prevent incident light leakage into adjacent pixels.

Although not shown in the drawings, pixel transistors (not shown) that read charges stored in the photodiodes PD and the like are also formed in the interface on the upper surface of the semiconductor substrate 12.

The insulating layer 46 is formed with a hafnium oxide ($HfO_2$) film, an oxide film ($SiO_2$), or a resin material such as styrene resin, acrylic resin, styrene-acrylic copolymer resin, or siloxane resin, for example. The insulating film 46 can be formed with a stack of insulating films of different types.

The interconnect layers 47 can be formed with metal films made of tungsten (W), aluminum (Al), copper (Cu), titanium (Ti), molybdenum (Mo), or nickel (Ni), for example. The interconnect layers 47 may be formed with different metal materials from one another.

At portions located higher than the interconnect layers 47 in the insulating layer 46, in-layer lenses (second lenses) 48 are formed for the respective pixels. The in-layer lenses 48 are made of a material having a higher refractive index $n_1$ than the refractive index $n_0$ of the insulating layer 46 surrounding the in-layer lenses 48 ($n_1 > n_0$). Each of the in-layer lenses 48 is formed with a nitride film (SiN), an oxynitride film (SiON), or an inorganic film such as a silicon carbide (SiC) film, for example.

The in-layer lens 48 of each pixel 2 is formed in a planar position deviated from the pixel center, and is asymmetrically located in the pixel. More specifically, the in-layer lenses 48 of the four pixels 2 for which one OCL 22A is provided are deviated away from the center position of the OCL 22A. The arrangement and the effects of the in-layer lenses 48 will be described later.

The color filters 21 of R, G, and B for the respective pixels are formed on the upper surface of the insulating layer 46.

The color filters 21 are formed by spin coating with a photosensitive resin containing coloring matter such as colorant or pigment.

Each one OCL 22A for four pixels is formed on the color filters 21. Each OCL 22A is formed with a resin material such as styrene resin, acrylic resin, styrene-acrylic copolymer resin, or siloxane resin.

The phase difference pixels 2A having OCLs 22A formed thereon in the solid-state imaging device 1 have the above described structure.

Although not shown in the drawings, the normal pixels 2B having OCLs 22B formed thereon differ from the phase difference pixels 2A shown in FIG. 3 only in that an OCL 22B is formed on each pixel, and the in-layer lenses 48 are symmetrically located in the pixels.

As described above, the solid-state imaging device 1 is a surface-illuminated MOS solid-state imaging device in which light enters from the surface side of the semiconductor substrate 12 having the pixel transistors and the interconnect layers 47 are formed thereon.

<Principles of Focus Detection from Imaging Surface Phase Differences>

Figure 4:
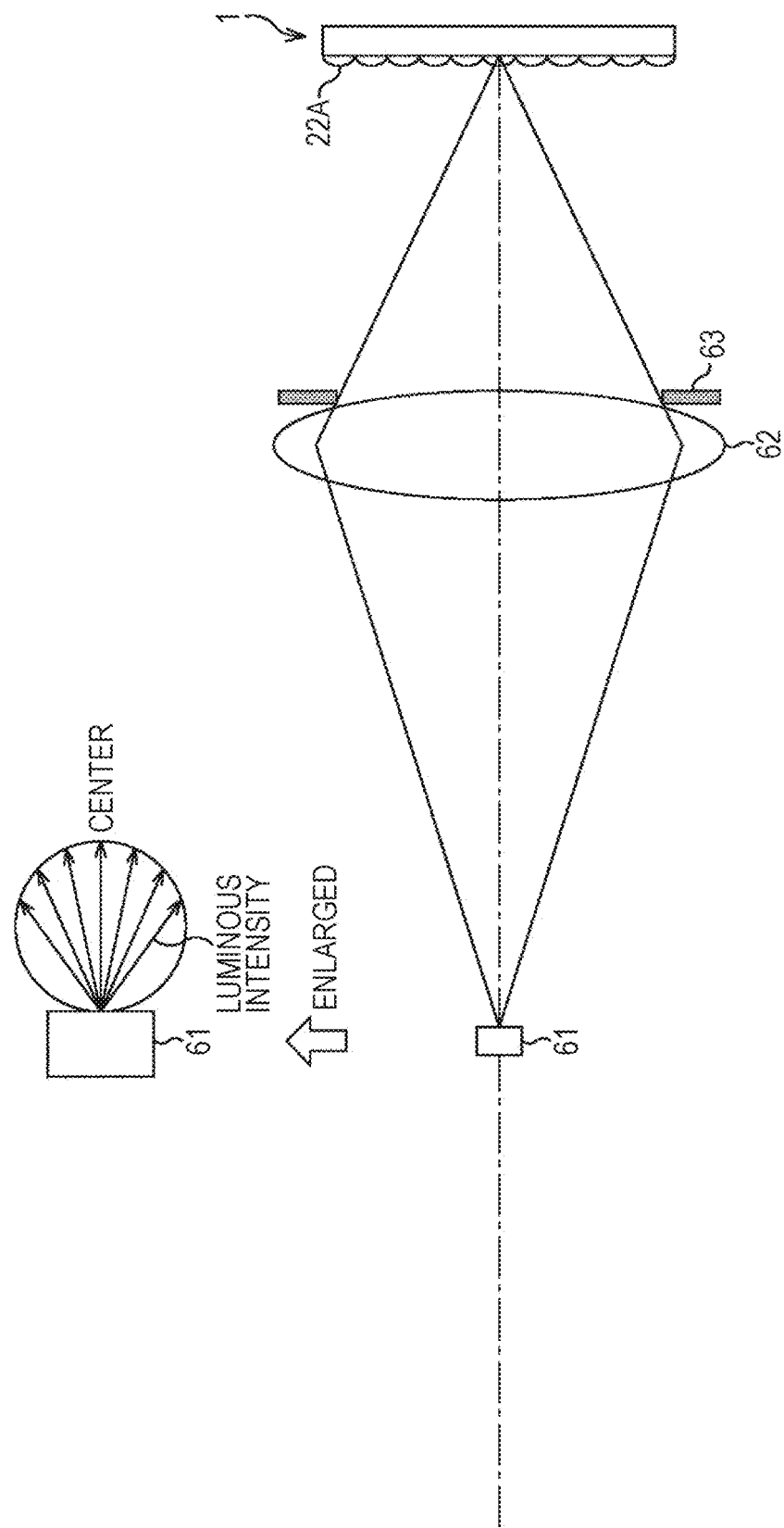
FIG. 4 is a diagram for explaining the principles of focus detection from imaging surface phase differences.
Figure 5:
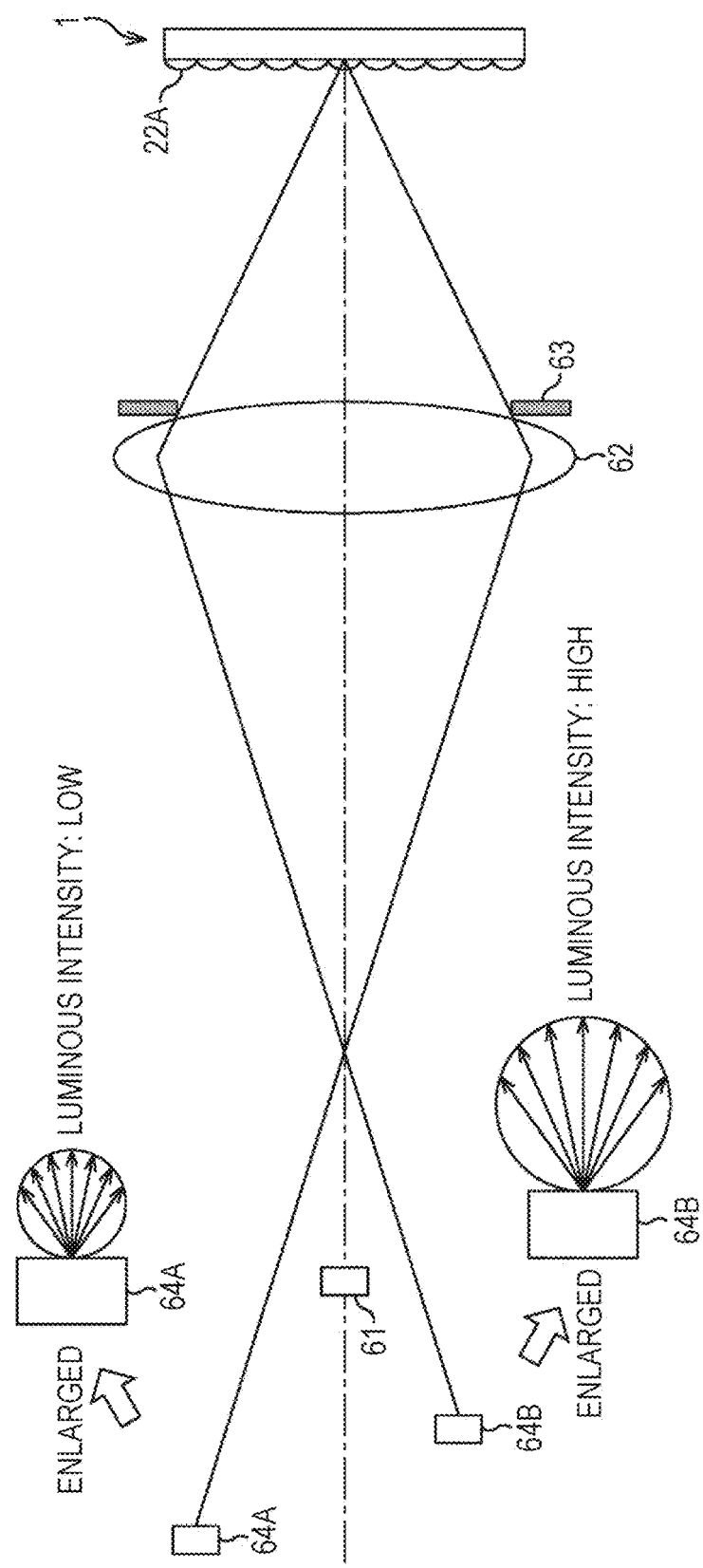
FIG. 5 is a diagram for explaining the principles of focus detection from imaging surface phase differences.

Referring now to FIGS. 4 and 5, the principles of focus detection from imaging surface phase differences.

FIG. 4 is a diagram showing a distribution of the intensity of light from an object on which a lens is focused.

It should be noted that the solid-state imaging device 1 shown in FIGS. 4 and 5 have only phase difference pixels 2A arranged thereon, for ease of explanation.

In a case where a lens is focused on an object 61, as shown in FIG. 4, light beams from one point of the object 61 are condensed on the solid-state imaging device 1 via an imaging lens 62 and a diaphragm 63. At this point, the distribution of the intensity of light from one point on the surface of the object 61 is often symmetrical about the center point. Particularly, in the case of a perfect diffuser panel, the distribution of the intensity of light is a spherical distribution, as shown in an enlarged view in FIG. 4. This means that, in the solid-state imaging device 1, the amount of light (illuminance) entering from left is equal to the amount of light (illuminance) entering from right at a time of light condensing. Therefore, in a case where the lens is in focus, the same amount of light enters two phase difference pixels 2A adjacent to each other in the horizontal direction among the phase difference pixels 2A sharing one OCL 22A.

FIG. 5 is a diagram showing a distribution of the intensity of light from an object on which a lens is not focused.

In a case where the lens is not focused on the object 61 or where the object 61 has moved away from the solid-state imaging device 1, as shown in FIG. 5, for example, light beams from another object (an object 64A or an object 64B) enter the solid-state imaging device 1, and therefore, the amounts of light entering from the left side and the right side differ from each other.

In view of the above, the imaging lens 62 is operated so that the amounts of light entering the phase difference pixels 2A aligned in the horizontal direction among the phase difference pixels 2A sharing one OCL 22A become equal to each other. In this manner, the imaging lens 62 can be focused on the object 61.

Although the amounts of light entering two phase difference pixels 2A aligned in the horizontal direction have been described above, the same as above applies to two phase difference pixels 2A adjacent to each other in the vertical direction among the phase difference pixels 2A sharing one OCL 22A. The same also applies to two phase difference pixels 2A adjacent to each other in a diagonal direction. That is, the same applies to symmetrical two portions formed by dividing the imaging surface into the two portions.

<Example Arrangement of in-Layer Lenses>

Figure 6:
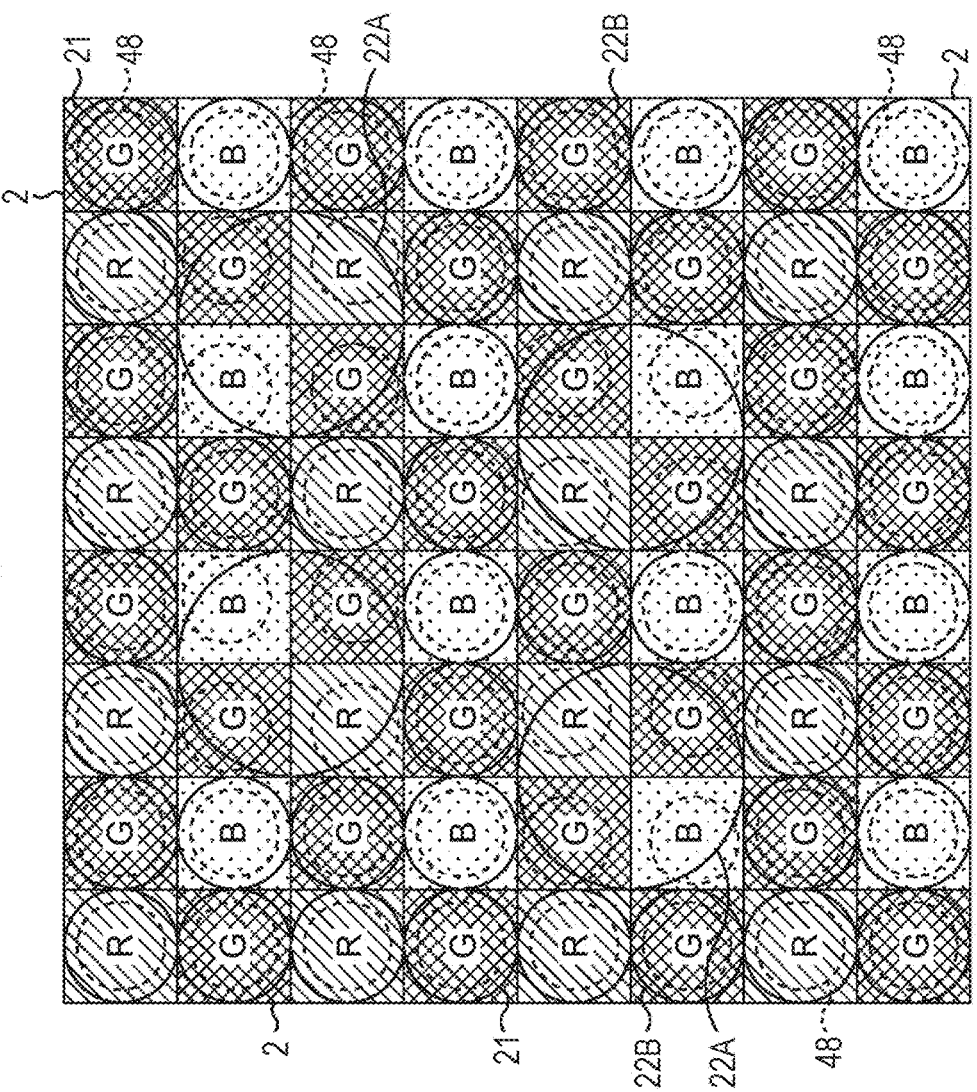
FIG. 6 is a top view of color filters and OCLs, also showing arrangement of in-layer lenses.

FIG. 6 is a diagram further showing in-layer lenses added to the top view in FIG. 2 showing an example arrangement of color filters and OCLs.

Figure 7:
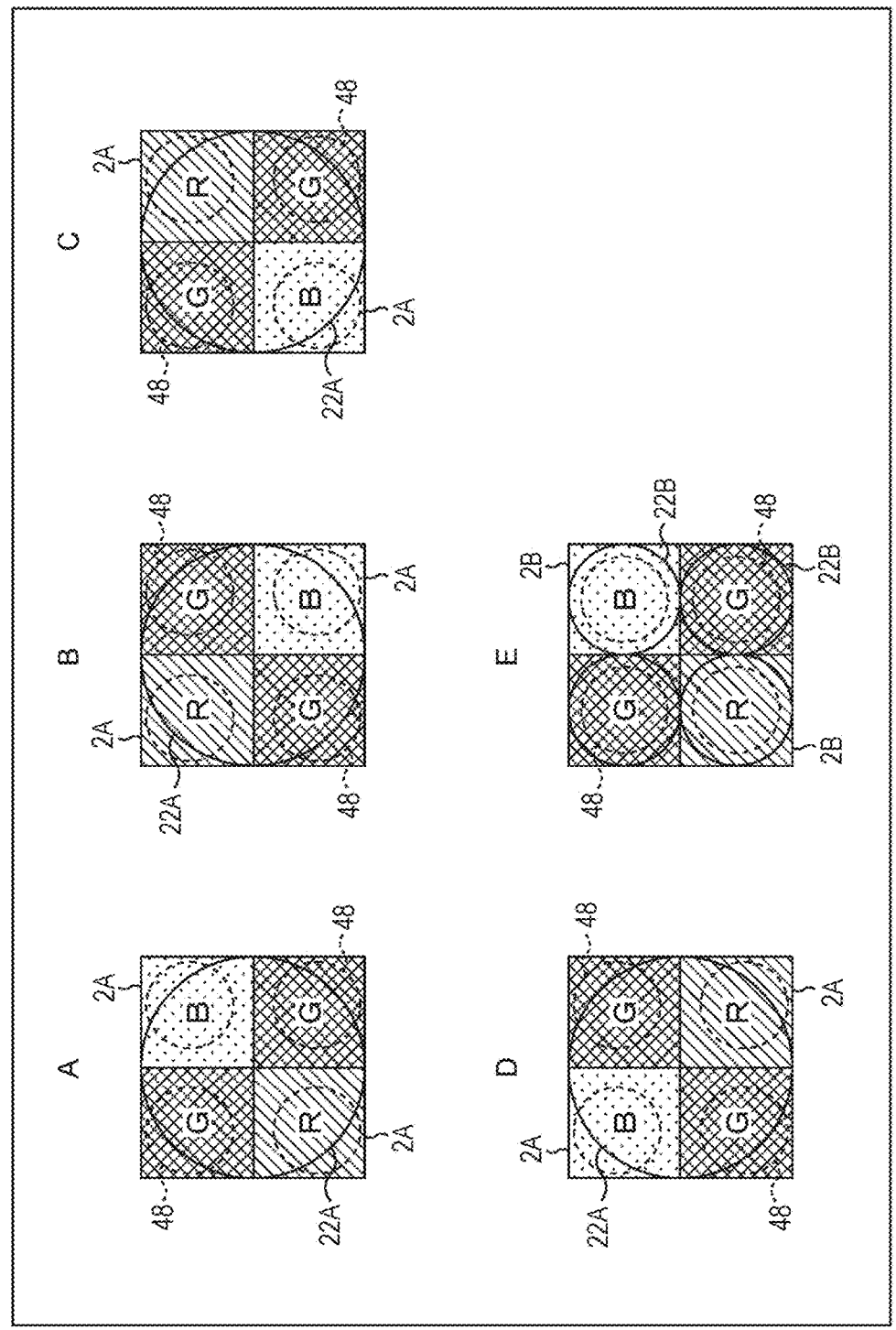
FIG. 7 is a top view of some portions extracted from FIG. 6.

FIG. 7 is a diagram showing sets of 2×2 or four phase difference pixels 2A on which OCLs 22A are arranged, and 2×2 or four normal pixels 2B on which OCLs 22B are arranged, of the example arrangement shown in FIG. 6.

In a case where the color filters 21 are arranged in the Bayer pattern, the combination of colors among the color filters 21 of four pixels on which OCLs 22A are arranged is one of the four types shown in A through D in FIG. 7.

In each of the sets of four pixels shown in A and C in FIG. 7, one piece of focal distance information is obtained with the two phase difference pixels 2A including the G color filters 21 located in the upper left position and the lower right position. Also, one piece of focal distance information is obtained with the two phase difference pixels 2A including the R and B color filters 21 located in the lower left position and the upper right position.

In each of the sets of four pixels shown in B and D in FIG. 7, one piece of focal distance information is obtained with the two phase difference pixels 2A including the G color filters 21 located in the lower left position and the upper right position. Also, one piece of focal distance information is obtained with the two phase difference pixels 2A including the R and B color filters 21 located in the upper left position and the lower right position.

As described above, the OCLs 22A are arranged in the solid-state imaging device 1 so that all conceivable combinations exist as the combinations of the colors among the color filters 21. In this manner, more accurate focal distance information is obtained. However, the four types of color combinations shown in A through D in FIG. 7 do not necessarily exist in the pixel array unit 3, as long as at least one of the four types exists in the pixel array unit 3.

As for the planar arrangements of the in-layer lenses 48, the in-layer lenses 48 placed below the OCLs 22A are deviated away from the center positions of the OCLs 22A among the phase difference pixels 2A, as shown in A through D in FIG. 7.

On the other hand, in the normal pixels 2B, the OCLs 22B serving as first lenses and the in-layer lenses 48 serving as second lenses are located at the centers of the pixels, as shown in E in FIG. 7. In the normal pixels 2B, the in-layer lenses 48 are not necessarily provided, and may be excluded.

<Example Shapes of In-Layer Lenses>

Figure 8:
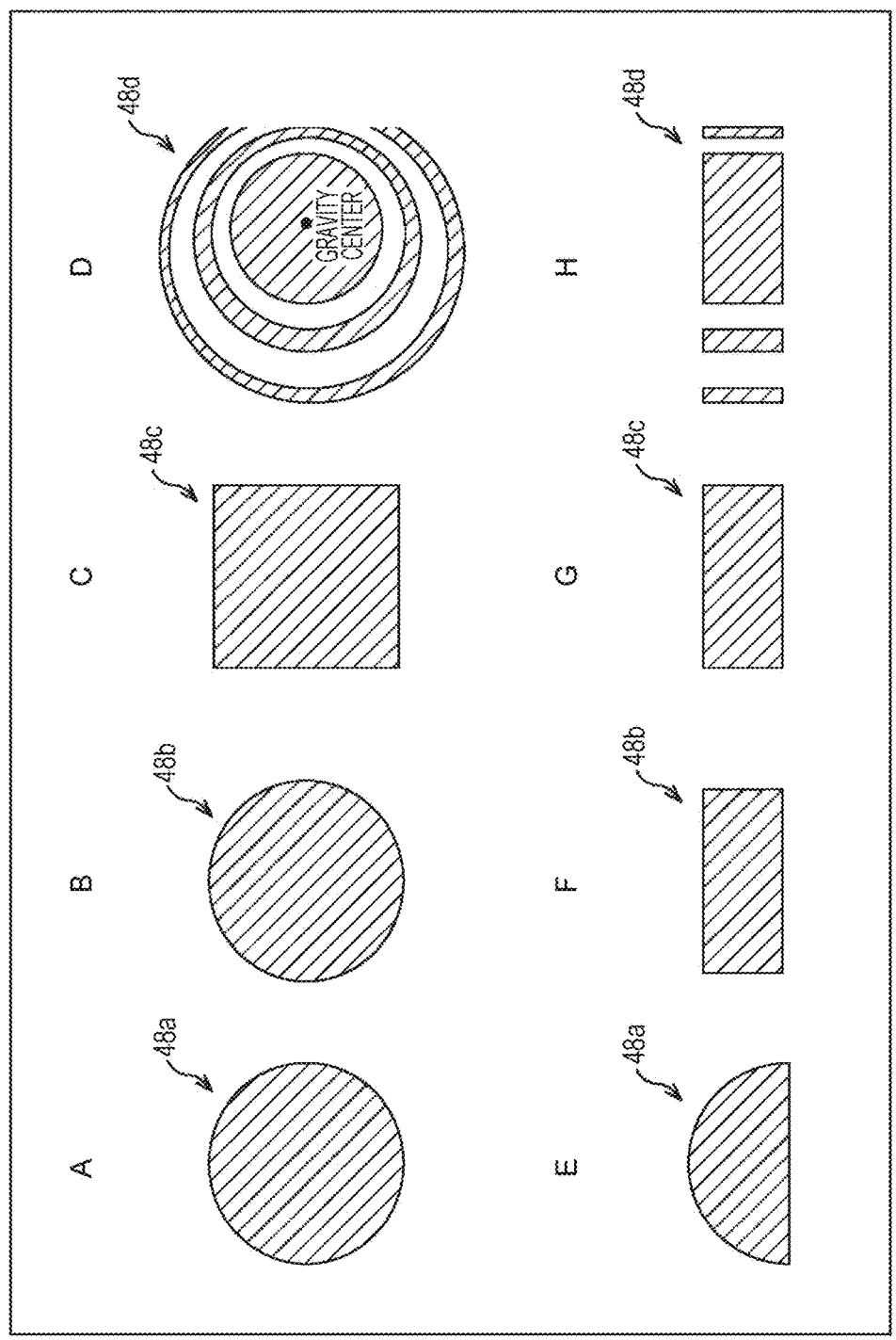
FIG. 8 is a diagram showing example shapes of in-layer lenses.

FIG. 8 is a diagram showing example shapes of the in-layer lenses 48.

The in-layer lenses 48 arranged in the insulating layer 46 of the pixels 2 may have one of the shapes of four types: in-layer lenses 48a through 48d shown in FIG. 8.

A through D in FIG. 8 are top views of the in-layer lenses 48a through 48d, and E through H in FIG. 8 are cross-sectional views of the in-layer lenses 48a through 48d.

The shape of the in-layer lens 48a shown in A and E in FIG. 8 is a semispherical shape.

The shape of the in-layer lens 48b shown in B and F in FIG. 8 is a circular cylindrical shape.

The shape of the in-layer lens 48c shown in C and G in FIG. 8 is a quadrangular cylindrical shape.

The shape of the in-layer lens 48d shown in D and H in FIG. 8 has a circular cylindrical shape in the innermost part and a ring-pattern shape outside the circular cylindrical shape, with the outer ring being thinner, when seen from above.

The in-layer lenses 48a through 48c are arranged in phase difference pixels 2A so that the center positions (the gravity centers) are deviated from the pixel centers, or more specifically, are deviated away from the centers of the OCLs 22A.

The in-layer lens 48d is located in the phase difference pixel 2A so that the gravity center of the ring-pattern shape is deviated from the pixel center, or more specifically, is deviated away from the center of the OCL 22A.

Here, the gravity center of the in-layer lens 48d having the ring-pattern shape can be expressed as a position $(x_1, y_1)$ in a case where the equation (1) shown below is satisfied.

[Mathematical Formula 1]

$$\iint_D (x_1 - x)(y_1 - y)f(x, y)dxdy = 0 \quad (1)$$

In the equation (1), D represents a planar region or a given region in the pixel whose gravity center is to be calculated, and f(x, y) represents a distribution function of a predetermined refractive index.

The equation (1) indicates that the position where the integral of the primary moment of the refractive index of the surrounding area is 0 is the gravity center $(x_1, y_1)$.

Figure 9:
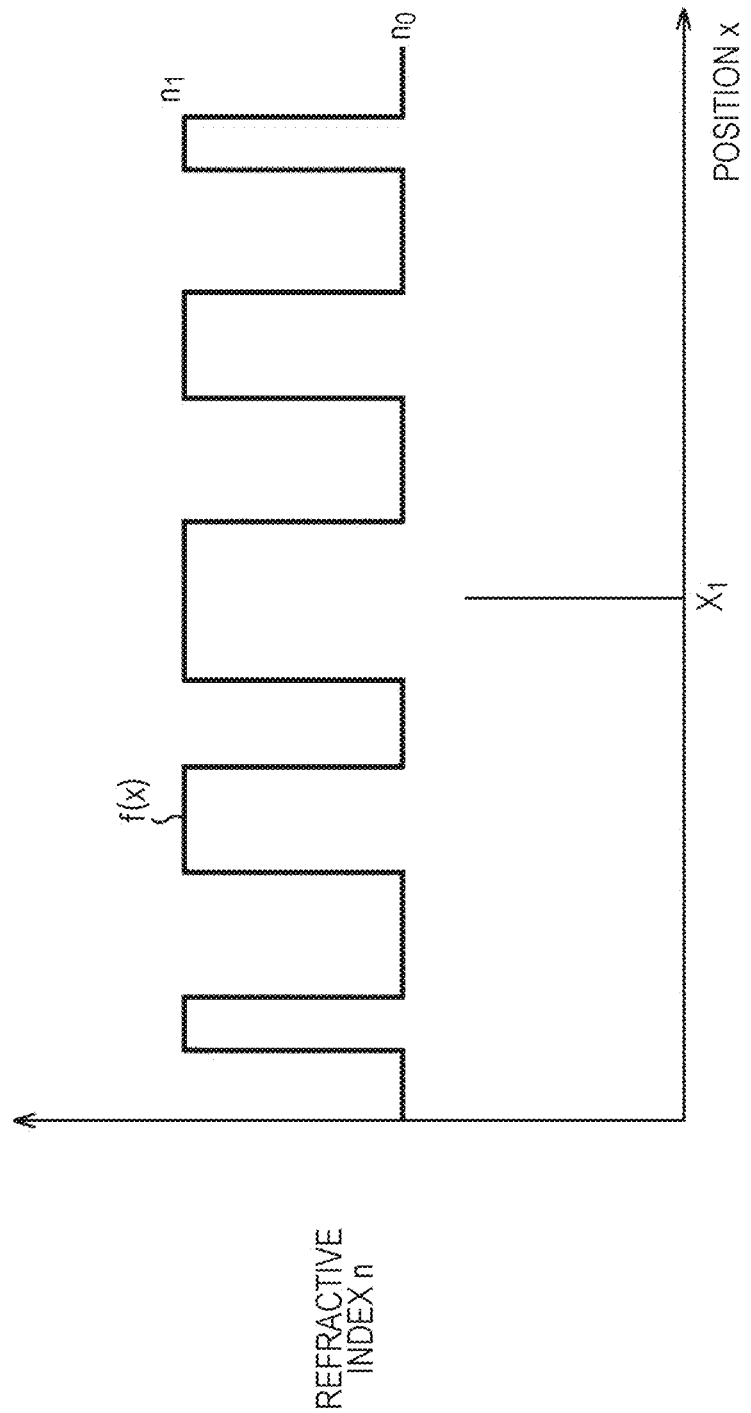
FIG. 9 is a diagram for explaining the gravity centers of in-layer lenses.

FIG. 9 is a conceptual diagram of the gravity center $x_1$ in a one-dimensional region formed with a layer having a high refractive index $n_1$ and a layer having a low refractive index $n_0$. In reality, the gravity center of the in-layer lens 48d having the ring-pattern shape is in a two-dimensional region, and therefore, is the position $(x_1, y_1)$, which satisfies the condition that the integral of x and y becomes 0.

Figure 10:
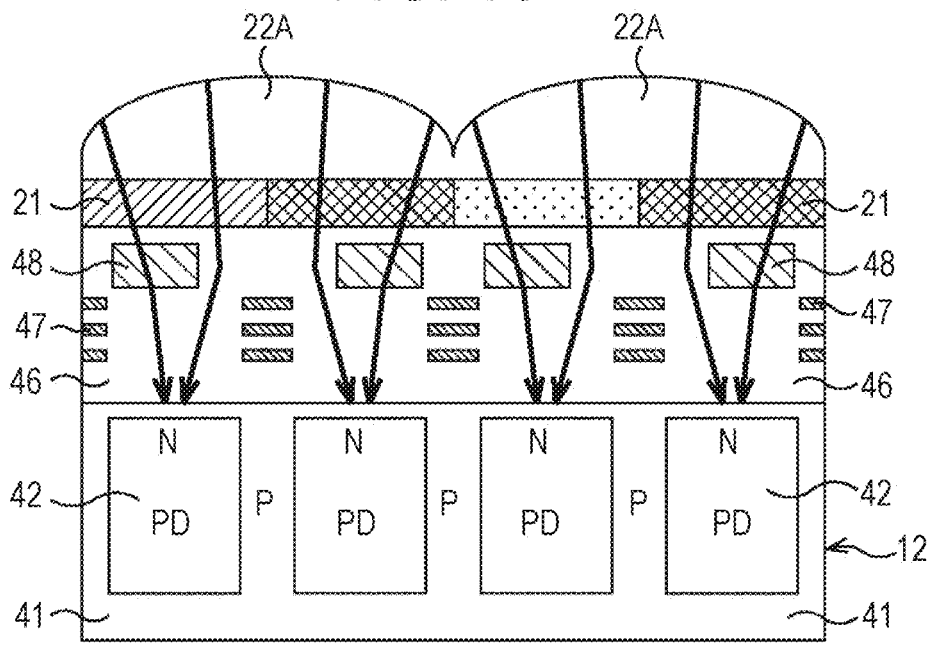
FIG. 10 is a diagram for explaining the effects of in-layer lenses.

As described above, in the phase difference pixels 2A, the proportion of the material having the higher refractive index $n_1$ than the refractive index $n_0$ of the insulating layer 46 is made higher in the direction away from the center positions of the OCLs 22A, so that the gravity centers of the in-layer lenses 48 are located in planar positions deviated from the pixel centers. With this arrangement, of light entering the regions near the centers of the OCLs 22A from a direction substantially perpendicular to the imaging surface, the light entering from right is guided to the right side, and the light entering from left is guided to the left side, as shown in FIG. 10.

Therefore, even in a case where one OCL 22A is provided for four phase difference pixels 2A, incident light is not condensed near the point of intersection between the boundary lines among the four pixels. Accordingly, the amounts of light entering the photodiodes PD of the respective phase difference pixels 2A can be increased.

Also, light that has entered the respective phase difference pixels 2A is restrained from entering adjacent pixels. Accordingly, color reproducibility degradation due to color mixing can be prevented.

Furthermore, light entering the respective phase difference pixels 2A is separated. Accordingly, the reliability of phase difference signals as the focal distance information becomes higher, and focus detection accuracy also becomes higher.

The phase difference pixels 2A of the present disclosure can be formed in the same pixel size as the normal pixels 2B. Accordingly, fine pixels of 1.5 μm or smaller, for example, can be readily manufactured.

That is, with the phase difference pixels 2A of the present disclosure, phase difference detection can be performed at a high sensitivity even in fine pixels.

Figure 11:
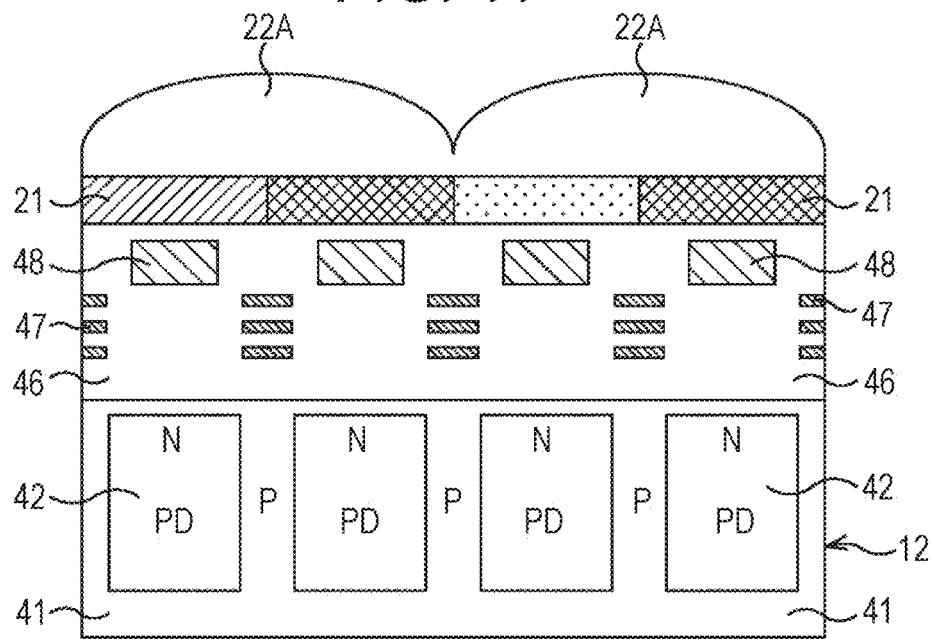
FIG. 11 is a cross-sectional structural view of a modification of phase difference pixels according to the first embodiment.

Although the details will be described later with reference to FIGS. 14 through 16, even in a case where the in-layer lenses 48 are arranged at the pixel centers as shown in FIG. 11, light from an object can be condensed, and a higher sensitivity can be achieved than in the structures disclosed in Patent Documents 1 through 3.

<Phase Difference Pixel Structures According to Patent Documents 1 Through 3>

Figure 12:
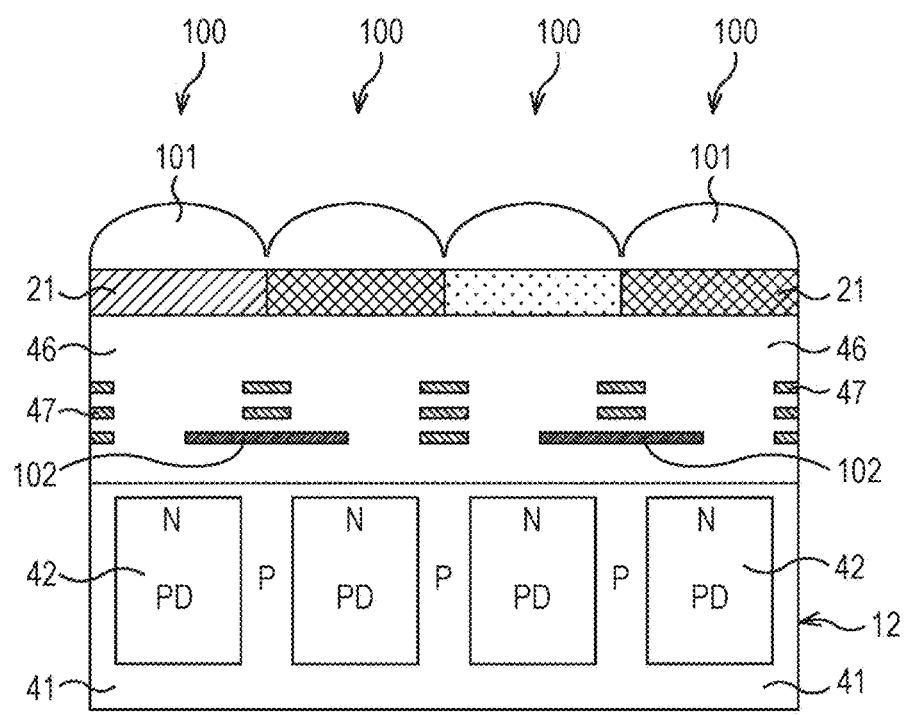

FIG. 12 shows a pixel structure of phase difference pixels disclosed in Patent Document 1 and the like.

Figure 13:
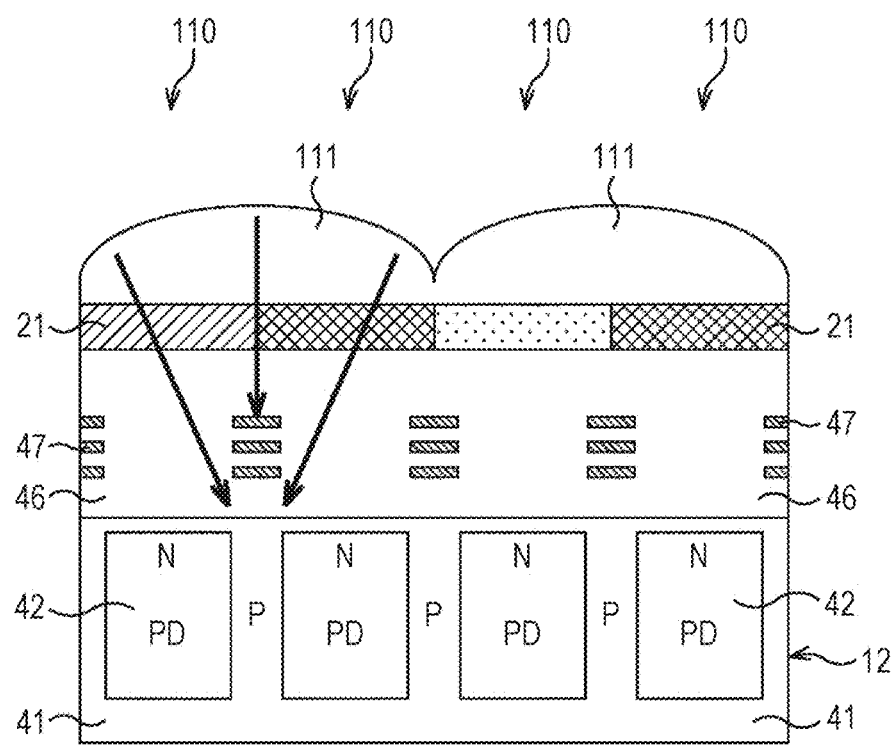

FIG. 13 shows a pixel structure of phase difference pixels disclosed in Patent Document 3 and the like.

In FIGS. 12 and 13, the components equivalent to those shown in FIG. 3 are denoted by the same reference numerals used in FIG. 3.

In phase difference pixels 100 in FIG. 12, OCLs 101 are formed for the respective pixels. Also, in the phase difference pixels 100, no in-layer lenses 48 are provided, and light shielding films 102 are formed so as to shield light in the right half or the left half of the light receiving region of each photodiode PD.

In such light-shielding phase difference pixels 100, the sensitivity is significantly lowered by the light shielding films 102, and pixel signals from the phase difference pixels 100 cannot be used for image generation. Therefore, the phase difference pixels 100 are defective pixels.

In view of this, the phase difference pixels 110 shown in FIG. 13 do not include the light shielding film 102, and each OCL 111 is provided for more than one pixel. With this arrangement, the phase difference pixels 110 can be prevented from becoming defective pixels, and focal distance information can be obtained from pixel signals from adjacent phase difference pixels 110.

In the pixel structure of the phase difference pixels 110 shown in FIG. 13, however, a light condensing spot is formed between two phase difference pixels 110. With this, the light that does not enter the photodiodes PD increases, resulting in a decrease in sensitivity. Also, more light enters the photodiodes PD of pixels adjacent to the pixels the light has originally entered. As a result, color reproducibility is degraded due to color mixing, and focus detection accuracy becomes lower.

In the phase difference pixels 2A of the present disclosure shown in FIG. 3, on the other hand, the in-layer lenses 48 serving as the second lenses are provided, so that incident light is not condensed at the pixel boundaries. For example, as shown in FIG. 10, light entering from right is guided to the right-side phase difference pixels 2A, and light entering from left is guided to the left-side phase difference pixels 2A.

<Wave Simulation Results>

Figure 14:
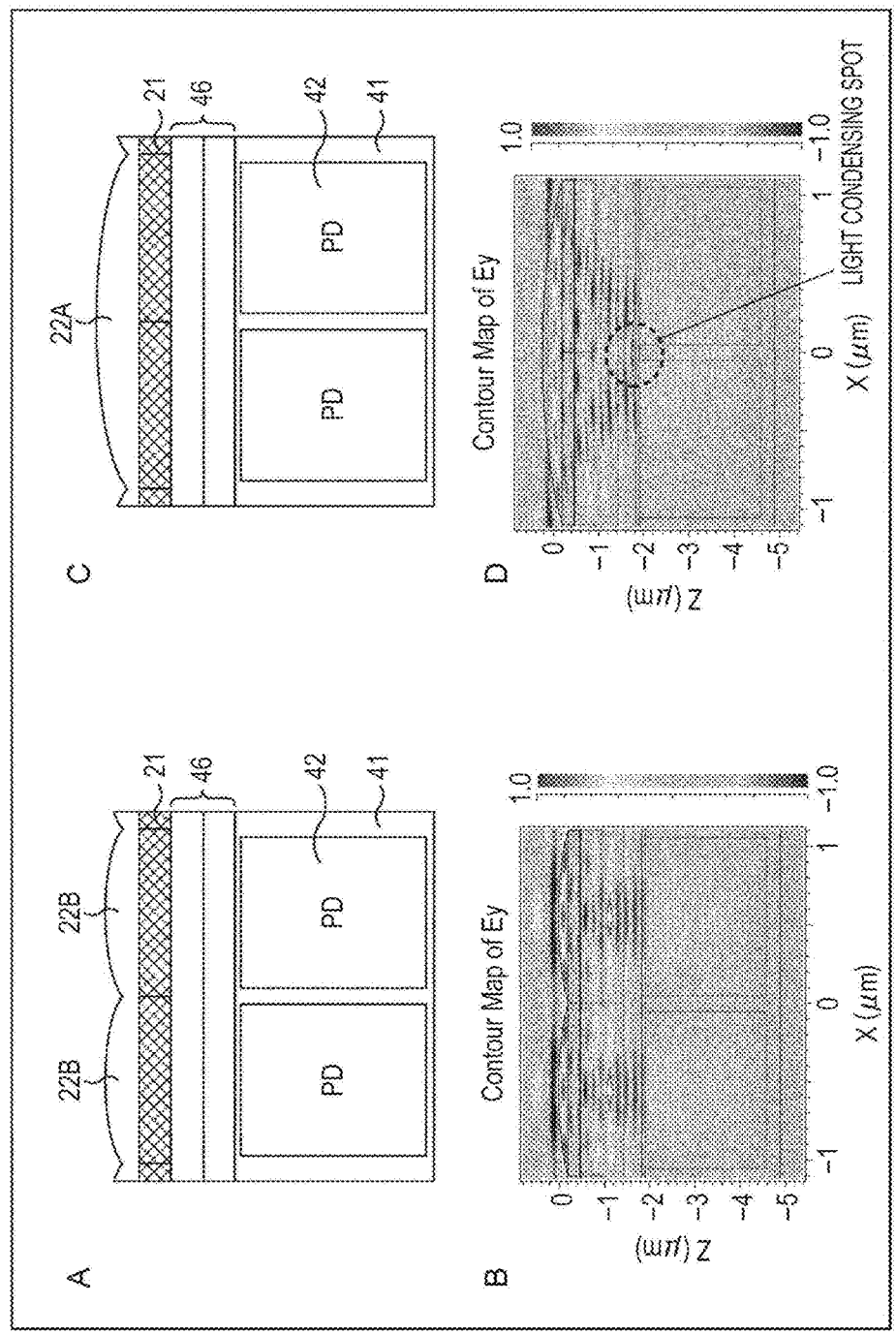
FIG. 14 is a diagram for explaining the effects of phase difference pixels according to the first embodiment.
Figure 15:
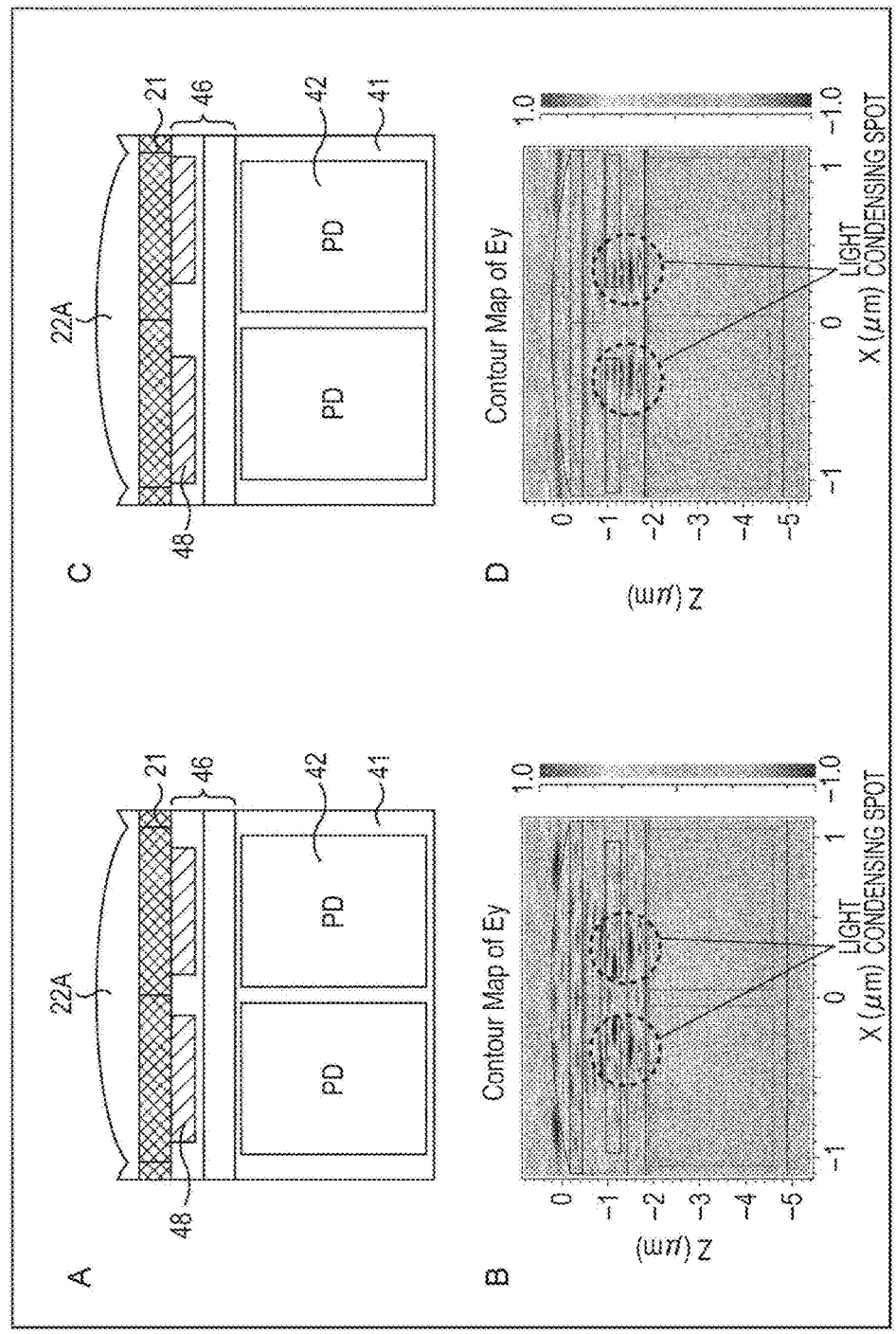
FIG. 15 is a diagram for explaining the effects of phase difference pixels according to the first embodiment.
Figure 16:
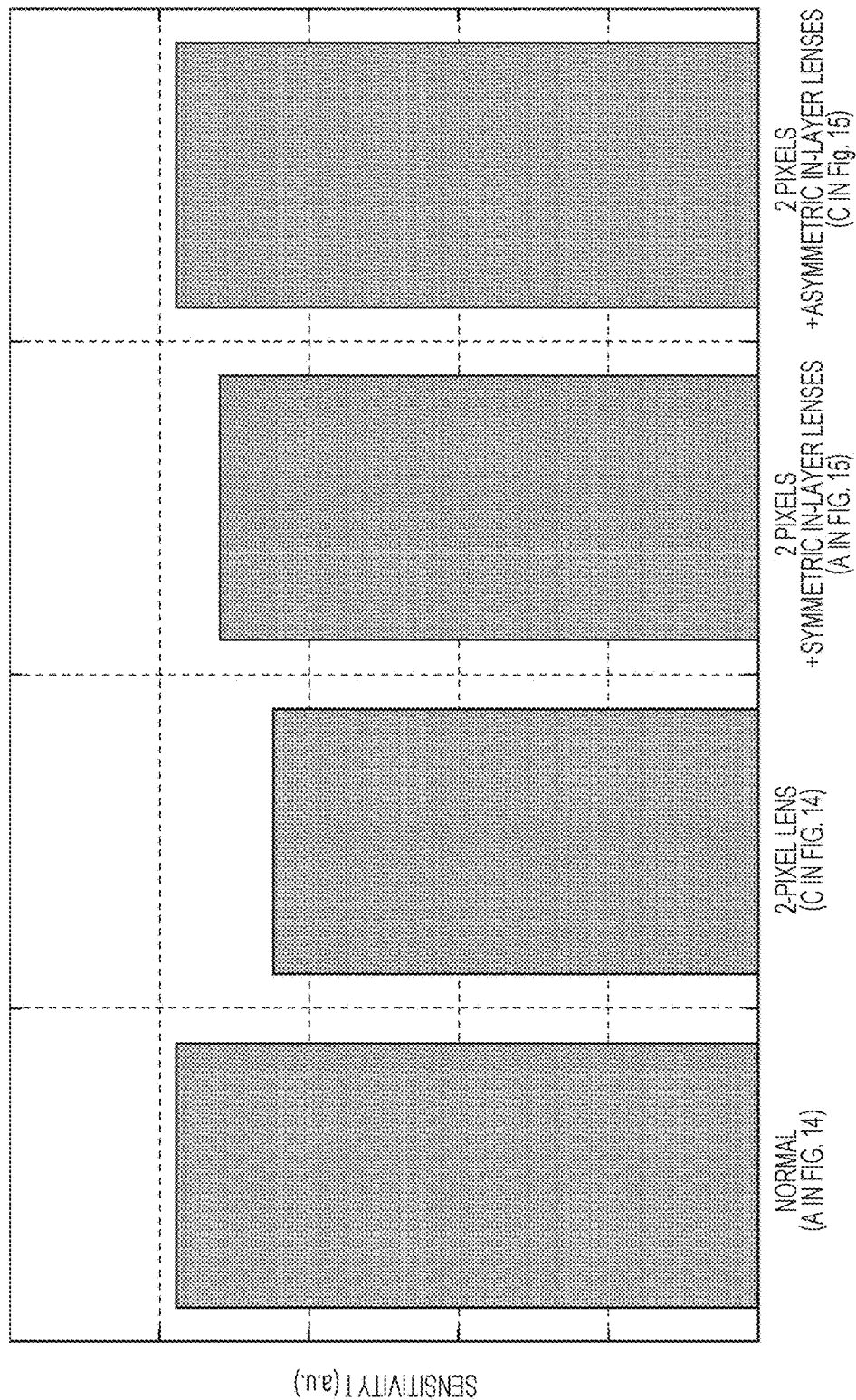
FIG. 16 is a diagram for explaining the effects of phase difference pixels according to the first embodiment.

Referring now to FIGS. 14 through 16, the effects of the phase difference pixels 2A according to the first embodiment are further described.

FIG. 14 shows the results of wave simulations performed by a Finite-Difference Time-Domain (FDTD) method on normal pixels each having one OCL provided therefor, and a two-pixel lens pixel structure in which one OCL is provided for four pixel (2×2 pixels).

A in FIG. 14 shows a normal pixel structure at a time of a wave simulation, and B in FIG. 14 shows the result of the simulation.

C in FIG. 14 shows a two-pixel lens pixel structure at a time of a wave simulation, and D in FIG. 14 shows the result of the simulation.

In A and C in FIG. 14, the components equivalent to those of the pixels 2 of the solid-state imaging device 1 are denoted by the corresponding reference numerals, for ease of comprehension of the pixel structures. The pixel structures shown in A and C in FIG. 14 do not have any in-layer lenses 48 as the second lenses.

FIG. 15 shows the result of wave simulations performed by the FDTD method on a pixel structure formed with phase difference pixels 2A having in-layer lenses 48 provided at the pixel centers as shown in FIG. 11, and phase difference pixels 2A having in-layer lenses 48 deviated from the pixel centers as shown in FIG. 3.

A in FIG. 15 shows a pixel structure of the phase difference pixels 2A shown in FIG. 11 at a time of a wave simulation, and B in FIG. 15 shows the result of the simulation.

As the simulation result shown in B in FIG. 15 is compared with the simulation result shown in D in FIG. 14, the effects of the insertion of the in-layer lenses 48 can be checked.

C in FIG. 15 shows a pixel structure of the phase difference pixels 2A shown in FIG. 3 at a time of a wave simulation, and D in FIG. 15 shows the result of the simulation.

As the simulation result shown in D in FIG. 15 is compared with the simulation result shown in B in FIG. 15, the effects of the deviation of the in-layer lenses 48 from the pixel centers can be checked.

The simulation results each indicate the optical electric field of TE waves (transverse electric waves) in a case where light of 540 nm in wavelength enters each corresponding pixel structure.

As can be seen from the simulation result shown in B in FIG. 14, light that has entered the normal pixels is condensed at the photodiodes PD of the respective pixels.

In the two-pixel lens pixel structure shown in C in FIG. 14, on the other hand, light condensing spots gather in the vicinity of the boundary between pixels as shown in D in FIG. 14.

As can be seen from the comparison between the simulation results shown in B in FIG. 15 and D in FIG. 14, in the pixel structure of the phase difference pixels 2A shown in FIG. 11, the in-layer lenses 48 are further provided in the pixels, so that the light condensing spots are separated from one another though not completely, and more light enters the photodiodes PD of the respective phase difference pixels 2A.

Furthermore, in a case where the in-layer lenses 48 are deviated from the pixel centers, the light condensing spots are more clearly separated from one another as shown in D in FIG. 15, and light that has entered the phase difference pixels 2A enters the respective photodiodes PD.

FIG. 16 shows estimated sensitivities of the photodiodes PD of the four simulated pixel structures shown in FIGS. 14 and 16.

With the sensitivity of the normal pixels in A in FIG. 14 being the reference sensitivity, the sensitivity of the two-pixel lens pixels in C in FIG. 14 is approximately 20% lower.

With the pixel structure in A in FIG. 15, or with a pixel structure of phase difference pixels 2A having in-layer lenses 48 symmetrically arranged in the pixels as shown in FIG. 11, the decrease in sensitivity can be reduced to approximately 10% of the decrease in the normal pixels shown in A in FIG. 14.

Further, with the pixel structure in D in FIG. 15, or a pixel structure of phase difference pixels 2A having in-layer lenses 48 asymmetrically arranged in the pixels as shown in FIG. 3, the sensitivity can be made substantially equal to the sensitivity of the normal pixels shown in A in FIG. 14.

As can be seen from the above simulation results, by virtue of insertion of the in-layer lenses 48, focusing can be performed without causing any pixel defects, and pixel signals from the phase difference pixels 2A can contribute to image generation as they are.

Also, as the pixel sensitivity for focusing is high, focusing can be performed even in a dark place. As the separation performance in the horizontal direction, the vertical direction, or a diagonal direction is excellent, a high degree of focusing accuracy is achieved. A pixel structure of phase difference pixels 2A is particularly effective in fine pixels with which it is difficult to achieve a high sensitivity.

That is, with the phase difference pixels 2A of the present disclosure, phase difference detection can be performed at a high sensitivity even in fine pixels.

<2. Second Embodiment>

Figure 17:
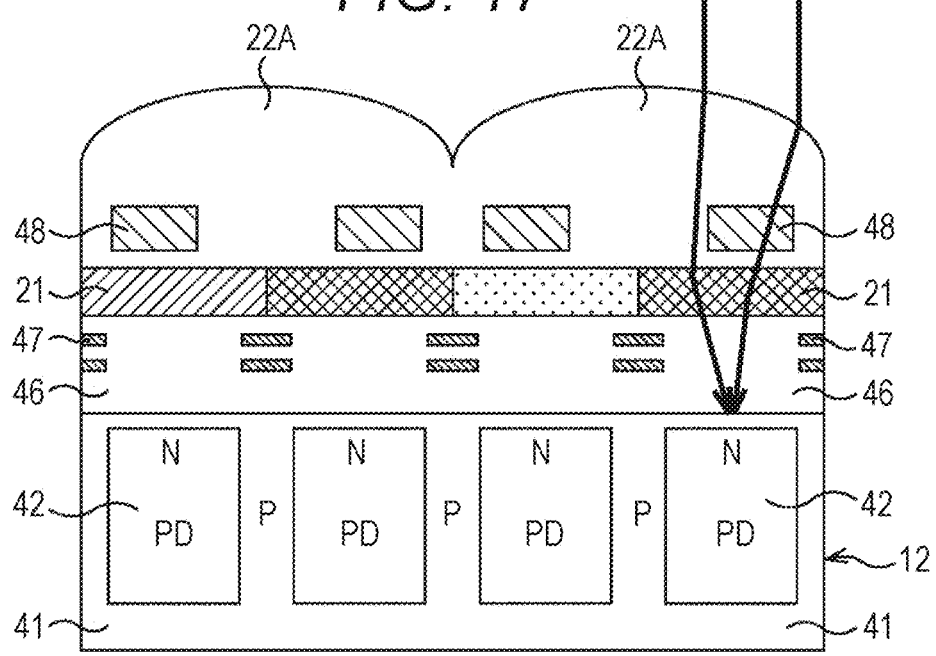
FIG. 17 is a cross-sectional structural view of phase difference pixels according to a second embodiment.

FIG. 17 is a cross-sectional structural view of phase difference pixels 2A according to a second embodiment.

In FIG. 17, the components equivalent to those of the first embodiment shown in FIG. 3 are denoted by the same reference numerals as those used in FIG. 3, and explanation of them will not be unnecessarily repeated.

A phase difference pixel 2A according to the second embodiment differs from the first embodiment in that the in-layer lens 48 is formed not below the color filter 21 but above the color filter 21. The gravity centers of the in-layer lenses 48 are deviated away from the centers of OCLs 22A and are located in positions deviated from the pixel centers. The other aspects of the second embodiment are the same as those of the first embodiment shown in FIG. 3.

In a case where the in-layer lenses 48 are provided above the color filters 21 as described above, light that enters portions near the centers of the OCLs 22A is guided toward the in-layer lenses 48, as indicated by arrows in FIG. 17.

Accordingly, the amounts of light entering the photodiodes PD of the respective phase difference pixels 2A can be increased, and color reproducibility degradation due to color mixing can be restrained. That is, photosensitivity becomes higher, and focus detection accuracy also becomes higher.

<3. Third Embodiment>

Figure 18:
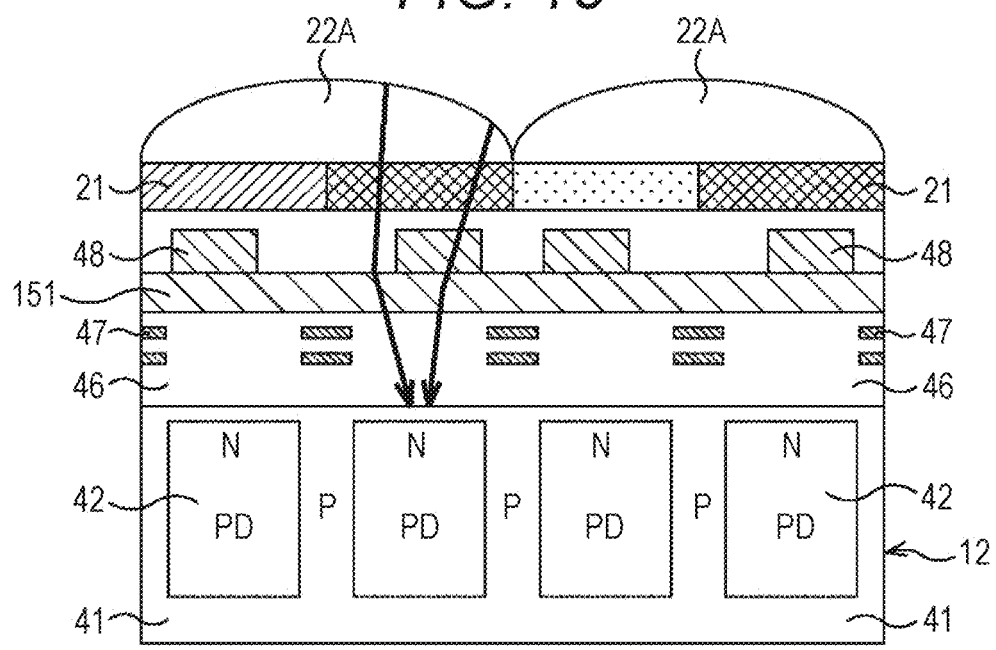
FIG. 18 is a cross-sectional structural view of phase difference pixels according to a third embodiment.

FIG. 18 is a cross-sectional structural view of phase difference pixels 2A according to a third embodiment.

In FIG. 18, the components equivalent to those of the first embodiment shown in FIG. 3 are denoted by the same reference numerals as those used in FIG. 3, and explanation of them will not be unnecessarily repeated.

The third embodiment differs from the first embodiment in that a protection film (passivation film) 151 is formed between the semiconductor substrate 12 and the color filters 21, and serves as a continuous film existing in the entire area of the pixel array unit 3.

In a case where the protection film 151 is formed as a continuous film as described above, the protection film 151 and the in-layer lenses 48 can be integrally formed with the same material, as shown in FIG. 18. Examples of materials that can be used as the protection film 151 and the in-layer lenses 48 include a nitride film (SiN) and an oxynitride film (SiON).

Although the in-layer lenses 48 are formed on the upper surface of the protection film 151 in the example shown in FIG. 18, the in-layer lenses 48 may be formed under the lower surface of the protection film 151.

In the third embodiment, the amounts of light entering the photodiodes PD of the respective phase difference pixels 2A can be increased, and color reproducibility degradation due to color mixing can be restrained, as in the above embodiments. That is, photosensitivity becomes higher, and focus detection accuracy also becomes higher.

<4. Fourth Embodiment>

Figure 19:
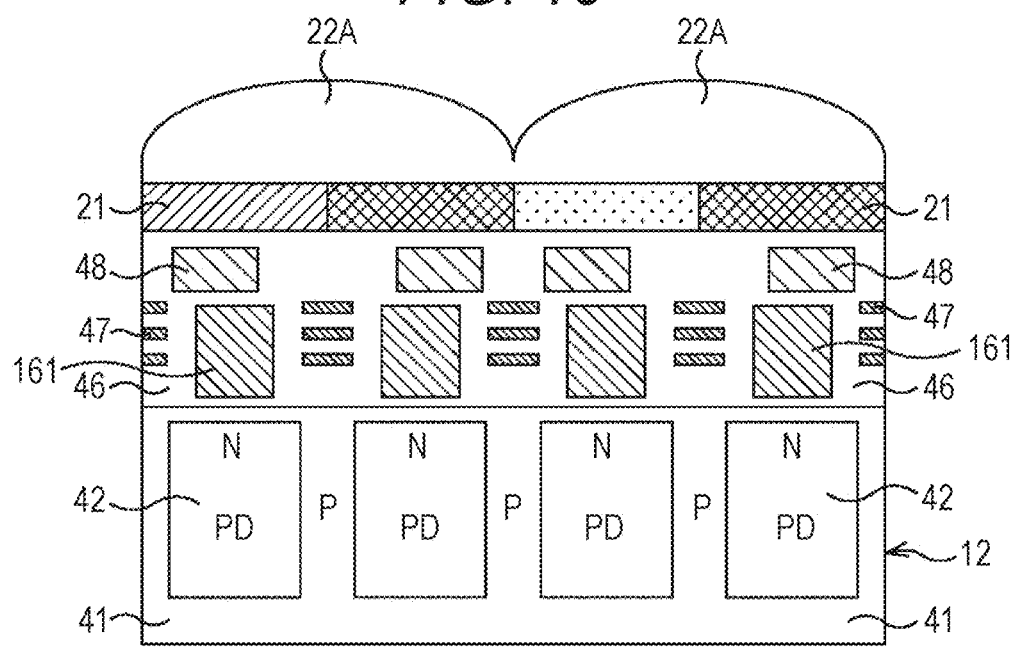
FIG. 19 is a cross-sectional structural view of phase difference pixels according to a fourth embodiment.

FIG. 19 is a cross-sectional structural view of phase difference pixels 2A according to a fourth embodiment.

In FIG. 19, the components equivalent to those of the first embodiment shown in FIG. 3 are denoted by the same reference numerals as those used in FIG. 3, and explanation of them will not be unnecessarily repeated.

The fourth embodiment differs from the first embodiment in that waveguides 161 are provided between the photodiodes PD in the semiconductor substrate 12 and the in-layer lenses 48.

The waveguides 161 are formed with a material having a higher refractive index than that of the insulating layer 46 surrounding the waveguides 161, so that light waves can be guided therethrough. However, the waveguides 161 may have any structures, as long as light waves can be guided therethrough. The material of the waveguides 161 may be the same as the material of the in-layer lenses 48. With the waveguides 161, the amounts of light entering the photodiodes PD can be further increased.

In the fourth embodiment that provides the waveguides 161, the amounts of light entering the photodiodes PD of the respective phase difference pixels 2A can be increased, and color reproducibility degradation due to color mixing can be restrained, as in the above embodiments. That is, photosensitivity becomes higher, and focus detection accuracy also becomes higher.

<5. Fifth Embodiment>

Figure 20:
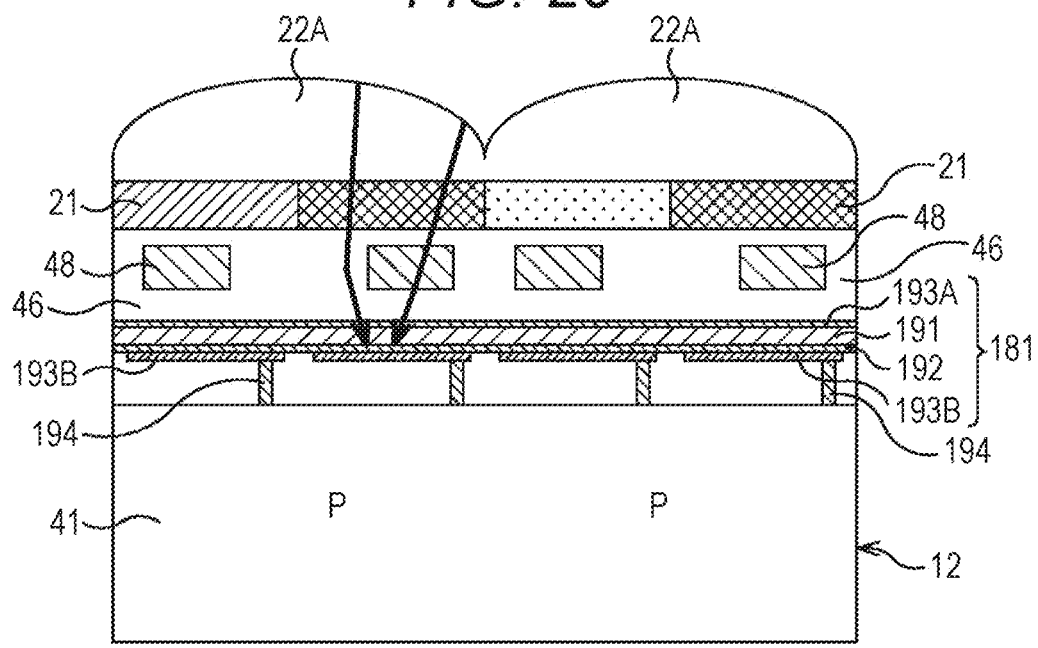
FIG. 20 is a cross-sectional structural view of phase difference pixels according to a fifth embodiment.

FIG. 20 is a cross-sectional structural view of phase difference pixels 2A according to a fifth embodiment.

In FIG. 20, the components equivalent to those of the first embodiment shown in FIG. 3 are denoted by the same reference numerals as those used in FIG. 3, and explanation of them will not be unnecessarily repeated.

The fifth embodiment differs from the first embodiment in that the photodiodes PD in the semiconductor substrate 12 are replaced with photoelectric conversion units 181 provided between the semiconductor substrate 12 and the in-layer lenses 48.

In such a pixel structure, the distance from the OCLs 22A serving as the first lenses to the in-layer lenses 48 serving as the second lenses is short, and therefore, the NA of the in-layer lenses 48 is preferably high. Also, as the shape of the in-layer lenses 48, the circular cylindrical shape, the quadrangular cylindrical shape, or the ring-pattern shape shown in B through D in FIG. 8 is preferable to the semispherical shape shown in A in FIG. 8.

The photoelectric conversion films 181 have a function of photoelectrically converting all wavelengths of incident light (white light). However, depending on the color filter 21, only R, G, or B light enters a photoelectric conversion unit 181, and therefore, the photoelectric conversion unit 181 performs photoelectric conversion on the R, G, or B light that has passed through the color filter 21.

The photoelectric conversion units 181 are formed by sandwiching a photoelectric conversion layer 191 and a buffer layer 192 between an upper electrode layer 193A and lower electrode layers 193B. The photoelectric conversion layer 191, the buffer layer 192, and the upper electrode layer 193A are formed as continuous films, and the lower electrode layers 193B are formed separately for the respective pixels. The lower electrode layers 193B are connected to the semiconductor substrate 12 by contact electrodes 194, and charges generated by the photoelectric conversion units 181 are transferred to an impurity region (not shown) in the semiconductor substrate 12 via the contact electrodes 194.

The photoelectric conversion layer 191 can be formed with an inorganic photoelectric conversion film, such as CuInSe2 (a CIS thin film) that is a semiconductor thin film of a chalcopyrite structure, or Cu(In,Ga)Se2 (a CIGS thin film) formed by adding Ga in the form of a solid solution to CuInSe2, for example. The buffer layer 192 may be formed with a CdS (cadmium sulfide) layer and a ZnO (zinc oxide) layer that are stacked, for example. The upper electrode layer 193A is formed with a material that passes the wavelength regions to be used in the device, such as a transparent electrode made of ITO (indium tin oxide) or ZnO. The lower electrode layers 193B may be made of Mo (molybdenum), for example.

The photoelectric conversion layer 191 may be formed with an organic photoelectric conversion film, instead of an inorganic photoelectric conversion film. The organic photoelectric conversion film preferably contains an organic p-type semiconductor and/or an organic n-type semiconductor. Examples of the organic p-type semiconductor and the organic n-type semiconductor include quinacridone derivatives, naphthalene derivatives, anthracene derivatives, phenanthrene derivatives, tetracene derivatives, pyrene derivatives, perylene derivatives, and fluoranthene derivatives.

In the fifth embodiment, by virtue of the in-layer lenses 48, light that enters portions near the centers of the OCLs 22A is guided toward the in-layer lenses 48, as indicated by arrows in FIG. 20.

Accordingly, the amounts of light entering the regions interposed between the upper electrode layer 193A and the lower electrode layers 193B of the photoelectric conversion units 181 of the respective phase difference pixels 2A can be increased, and color reproducibility degradation due to color mixing can be restrained, as in the above embodiments. That is, photosensitivity becomes higher, and focus detection accuracy also becomes higher.

<6. Sixth Embodiment>

Figure 21:
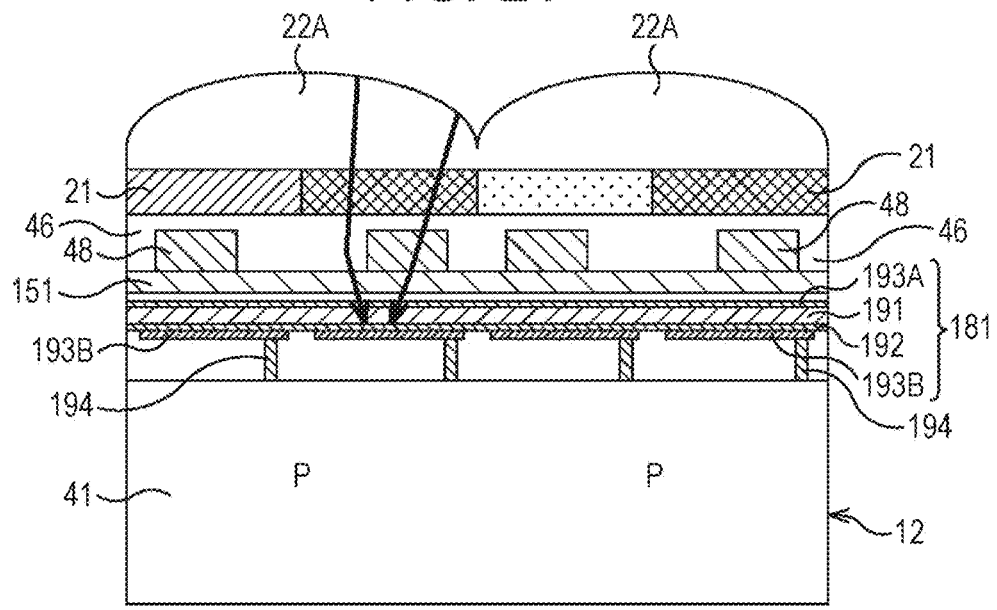
FIG. 21 is a cross-sectional structural view of phase difference pixels according to a sixth embodiment.

FIG. 21 is a cross-sectional structural view of phase difference pixels 2A according to a sixth embodiment.

In FIG. 21, the components equivalent to those of the first through fifth embodiments are denoted by the same reference numerals as those used in the above embodiments, and explanation of them will not be unnecessarily repeated.

A pixel structure of phase difference pixels 2A according to the sixth embodiment is the same as the pixel structure of the phase difference pixels 2A according to the fifth embodiment shown in FIG. 20, except that the protection film 151 employed in the third embodiment shown in FIG. 18 is added to the pixel structure.

This protection film 151 is particularly effective in a case where a film that easily deteriorates due to moisture penetration, such as an organic photoelectric conversion film, is used as the photoelectric conversion layer 191 of the photoelectric conversion units 181 provided outside the semiconductor substrate 12.

In the sixth embodiment, the amounts of light entering the photoelectric conversion units 181 of the respective phase difference pixels 2A can be increased, and color reproducibility degradation due to color mixing can be restrained, as in the above embodiments. That is, photosensitivity becomes higher, and focus detection accuracy also becomes higher.

<7. Seventh Embodiment>

Figure 22:
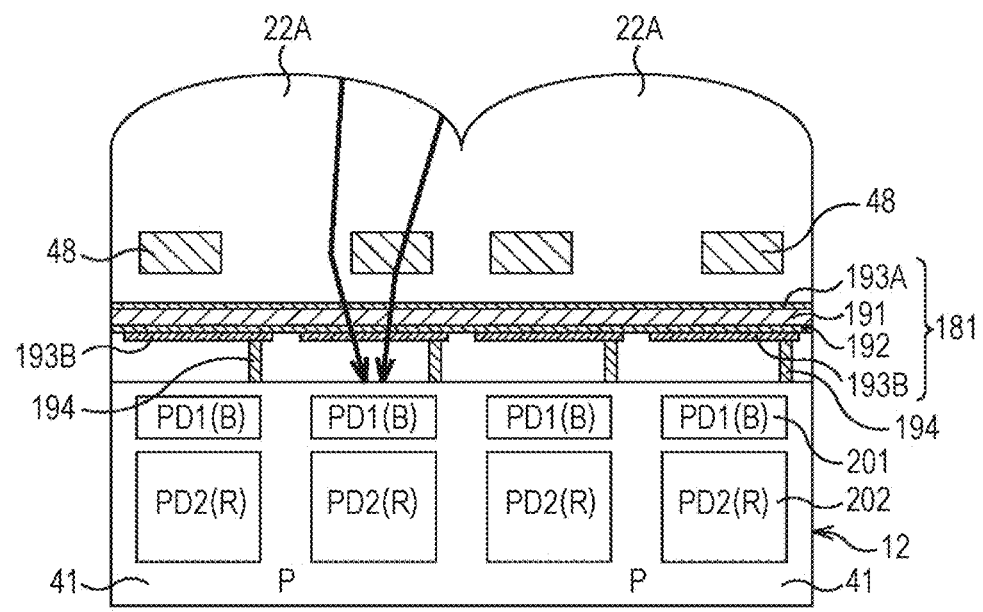
FIG. 22 is a cross-sectional structural view of phase difference pixels according to a seventh embodiment.

FIG. 22 is a cross-sectional structural view of phase difference pixels 2A according to a seventh embodiment.

In FIG. 22, the components equivalent to those of the first through sixth embodiments are denoted by the same reference numerals as those used in the above embodiments, and explanation of them will not be unnecessarily repeated.

In the first through sixth embodiments described above, each pixel 2 is designed to perform photoelectric conversion only on R, G, or B light that has passed the color filter 21. In the seventh embodiment, on the other hand, no color filters 21 are provided as shown in FIG. 22, and each pixel 2 performs photoelectric conversion on light in all the wavelength regions of R, G, and B.

In the phase difference pixels 2A shown in FIG. 22, photoelectric conversion units 181 are provided above the semiconductor substrate 12. In the seventh embodiment, a photoelectric conversion film that performs photoelectric conversion on green (G) light, such as quinacridone, is used as the photoelectric conversion layer 191 of the photoelectric conversion units 181.

Further, in each of the phase difference pixels 2A, two N-type semiconductor regions 201 and 202 are stacked in the depth direction in the P-type semiconductor region 41 of the semiconductor substrate 12, and photodiodes PD1 and PD2 are formed by the two PN junctions. Because of a difference in light absorption coefficient, the photodiodes PD1 perform photoelectric conversion on blue (B) light, and the photodiodes PD2 perform photoelectric conversion on red (R) light.

In the phase difference pixels 2A according to the seventh embodiment having the above described structure, each pixel can receive R, G, and B light, and accordingly, there is no difference due to a color array. Thus, in the four phase difference pixels 2A sharing one OCL 22A, it is possible to detect focal distance information (a phase difference) formed with signals in the same color in the two directions: focal distance information about the upper left pixel and the lower right pixel, and distance information about the lower left pixel and the upper right pixel. With this, more accurate focus detection can be performed.

In the seventh embodiment, the amounts of light entering the photoelectric conversion units 181 of the respective phase difference pixels 2A can be increased, and color reproducibility degradation due to color mixing can be restrained, as in the above embodiments. That is, photosensitivity becomes higher, and focus detection accuracy also becomes higher.

<8. Application of Exit Pupil Correction>

The pixels 2 of each of the above embodiments can be designed to perform exit pupil correction.

Figure 23:
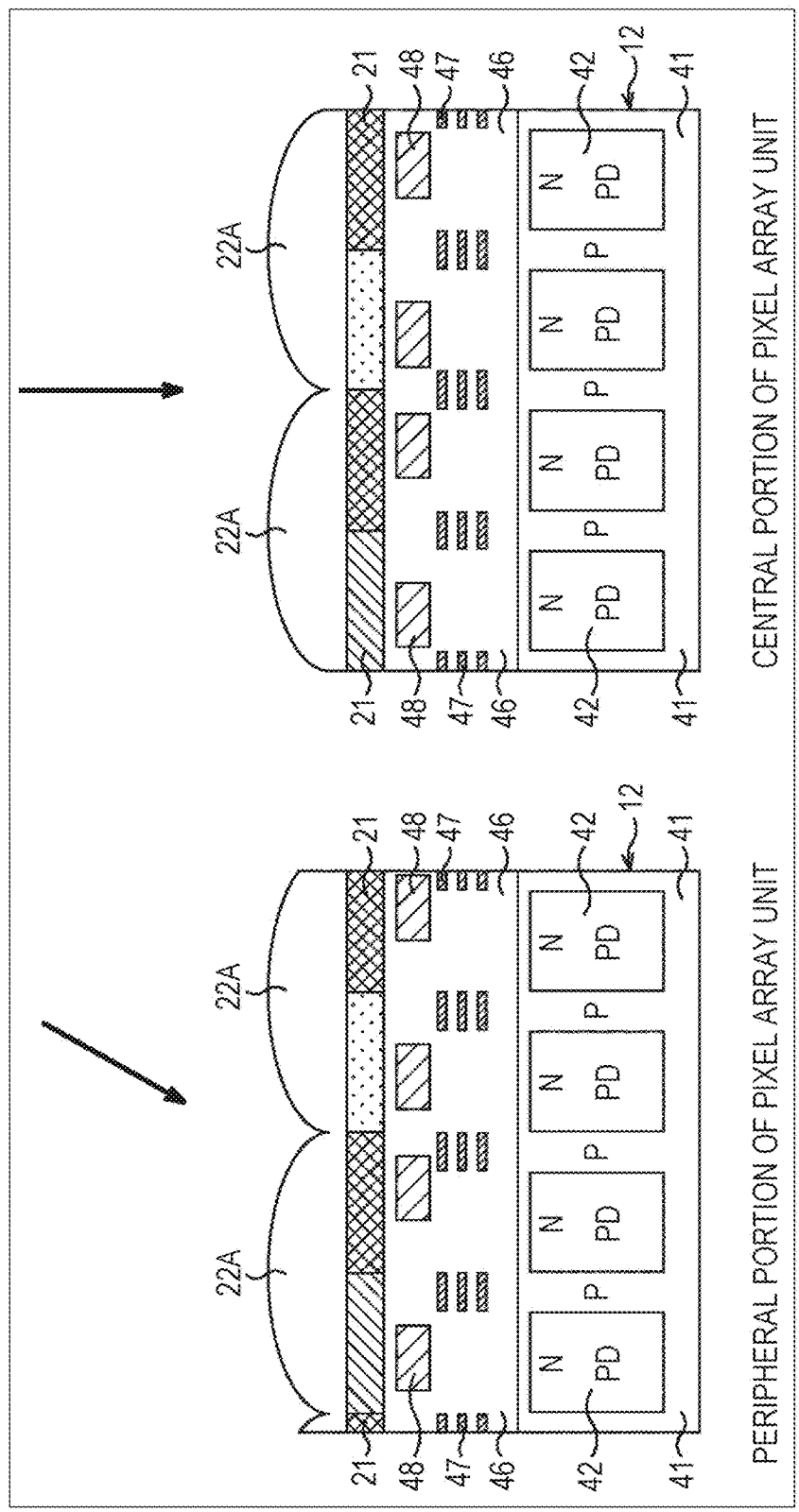
FIG. 23 is a diagram for explaining exit pupil correction.

Referring to FIG. 23, a case where exit pupil correction is performed on phase difference pixels 2A according to the first embodiment is described.

FIG. 23 shows a cross-section of phase difference pixels 2A placed in the central portion of the pixel array unit 3, and a cross-section of phase difference pixels 2A placed in a peripheral portion of the pixel array unit 3.

In the central portion of the pixel array unit 3, the incidence angle of the principal ray of incident light from the imaging lens 62 (FIG. 4) is 0 degrees (vertical), and therefore, exit pupil correction is not performed. In other words, the on-chip lenses OCL 22A and the in-layer lenses 48 are arranged so that the center among the four photodiodes PD of the four pixels sharing one on-chip lens OCL 22A corresponds to the center of the on-chip lens OCL 22A and the center (the gravity center) among the four in-layer lenses 48, as shown in the right half of FIG. 23.

In a peripheral portion of the pixel array unit 3, on the other hand, the incidence angle of the principal ray of incident light from the imaging lens 62 is a predetermined angle (oblique) depending on the design of the imaging lens 62. Therefore, if the on-chip lenses OCL 22A and the in-layer lenses 48 are arranged in the same manner as in the central portion of the pixel array unit 3, there will be a decrease in sensitivity due to shading, leakage of incident light into adjacent pixels, and the like. Therefore, exit pupil correction is performed in the peripheral portion of the pixel array unit 3.

Specifically, the on-chip lenses OCL 22A and the in-layer lenses 48 are arranged so that, among four pixels sharing one on-chip lens OCL 22A, the center of the on-chip lens OCL 22A and the center (the gravity center) among the four in-layer lenses 48 are deviated from the center among the four photodiodes PD to the central portion of the pixel array unit 3, as shown in the left half of FIG. 23. The deviations in this case are larger in pixel positions that are closer to the outer circumference (or farther away from the central portion) of the pixel array unit 3.

In the exit pupil correction, the color filters 21 are also adjusted in accordance with the deviations of the on-chip lenses OCL 22A and the in-layer lenses 48.

Although the exit pupil correction is performed on phase difference pixels 2A in the example shown in FIG. 23, the exit pupil correction can also be performed on normal pixels 2B. In a case where exit pupil correction is performed on normal pixels 2B, the centers of the color filters 21, the on-chip lenses OCL 22B, and the in-layer lenses 48 of pixels closer to the outer circumference of the pixel array unit 3 are deviated farther away from the centers of the photodiodes PD to the central portion of the pixel array unit 3.

Although the exit pupil correction is performed on phase difference pixels 2A according to the first embodiment in the example shown in FIG. 23, it is of course possible to perform the exit pupil correction on pixels 2 according to any of the other embodiments.

<9. Other Examples of Color Filters and OCLs>

<First One of the Other Examples of OCLs>

Figure 24:
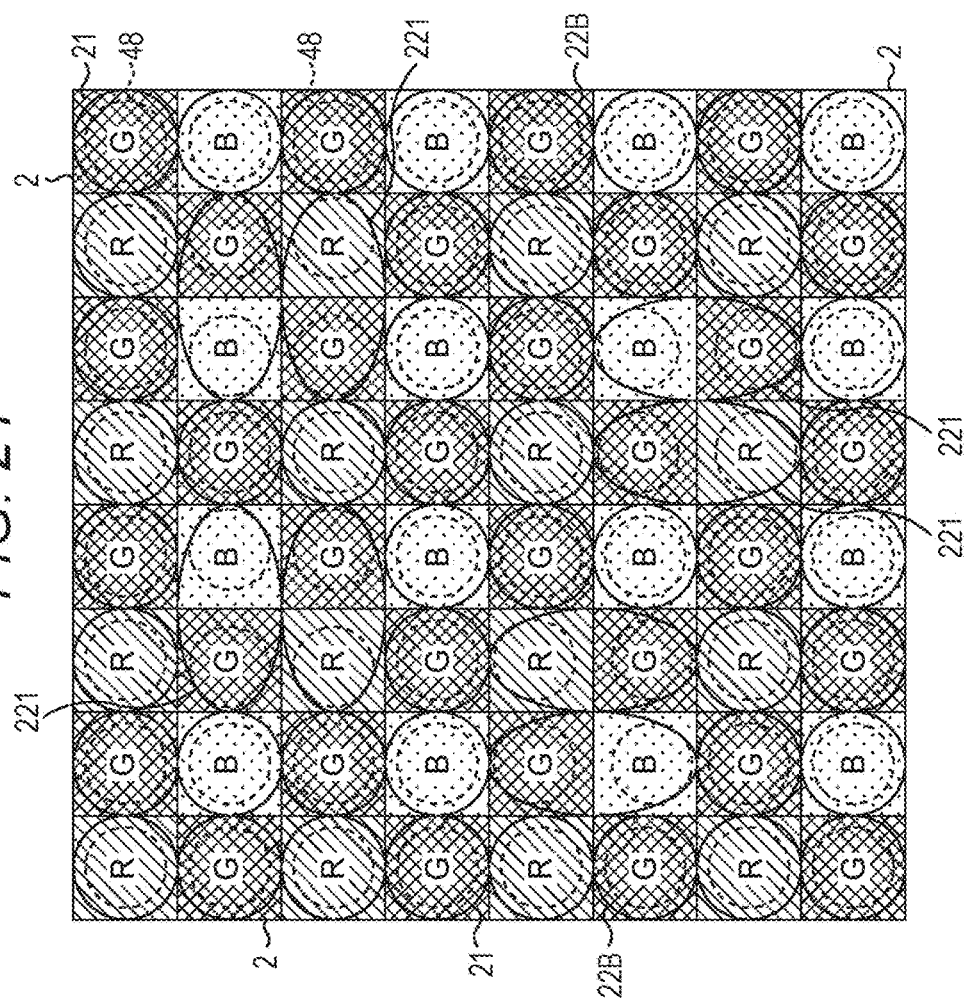
FIG. 24 shows a first one of other examples of OCLs.

FIG. 24 shows a first one of other examples of OCLs.

In each of the above described embodiments, one OCL 22A is formed for 2×2 pixels or four pixels.

In the example shown in FIG. 24, on the other hand, one OCL 221 is formed for two pixels, and two OCLs 221 are provided and aligned in the vertical direction or in the horizontal direction for predetermined 2×2 or four pixels in the pixel array unit 3.

Figure 25:
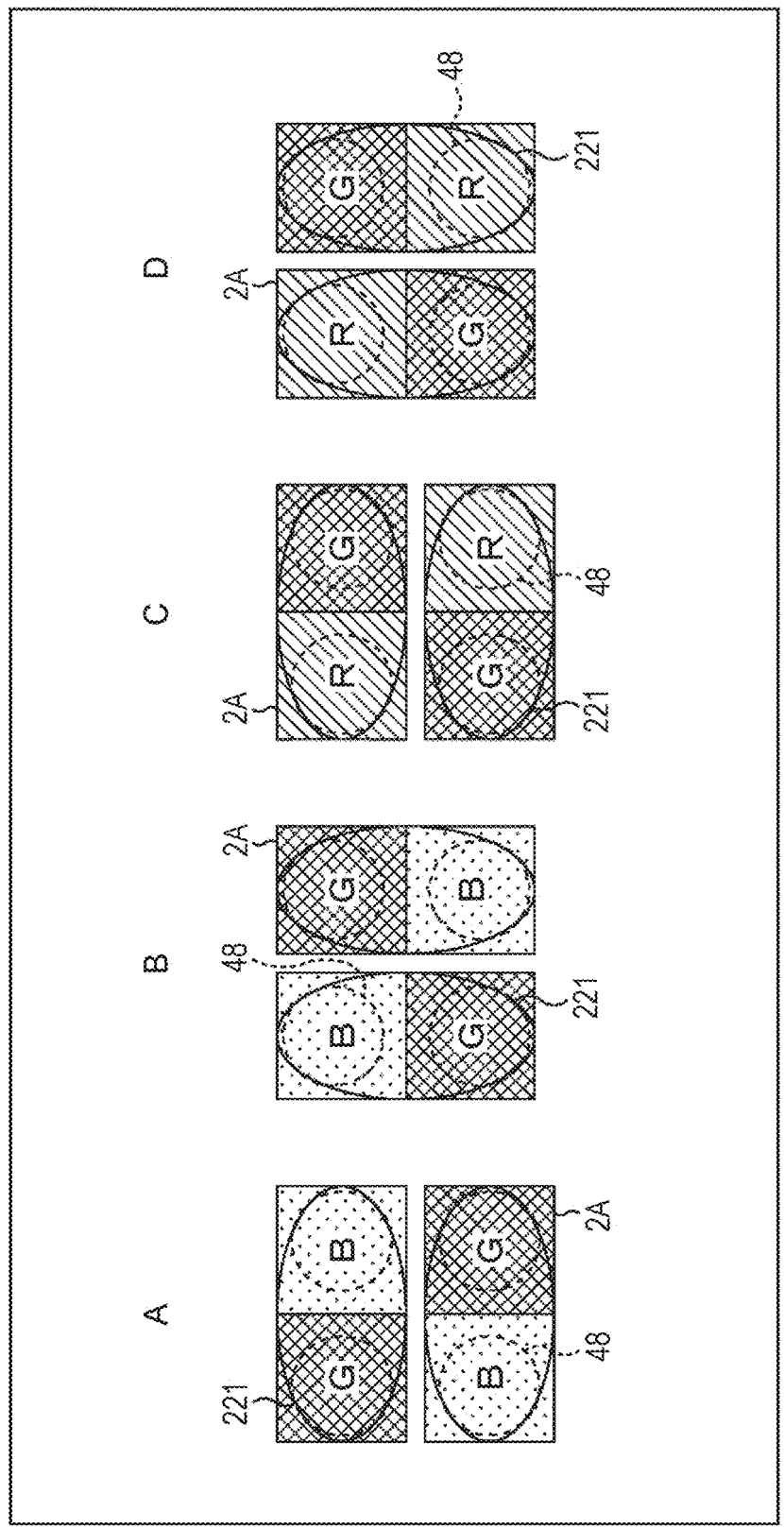
FIG. 25 is a top view of some portions extracted from FIG. 24.

FIG. 25 is a diagram showing only the phase difference pixels 2A on which the OCLs 221 are placed in FIG. 24.

As shown in FIG. 25, there are a total of eight types of color combinations among the color filters 21 of phase difference pixels 2A on which one OCL 221 is formed.

In this case, phase difference detection is performed with the use of two phase difference pixels 2A having color filters 21 of the same color, with the inclinations of the slopes of the OCLs 221 on the two phase difference pixels 2A being the opposite to each other (symmetrical).

Specifically, focal distance information using G pixel signals is obtained from the two phase difference pixels 2A having G color filters 21 in A in FIG. 25, and focal distance information using B pixel signals is obtained from the two phase difference pixels 2A having B color filters 21 in A in FIG. 25.

Also, focal distance information using G pixel signals is obtained from the phase difference pixels 2A having G color filters 21 in B in FIG. 25, and focal distance information using B pixel signals is obtained from the phase difference pixels 2A having B color filters 21 in B in FIG. 25.

Further, focal distance information using G pixel signals is obtained from the phase difference pixels 2A having G color filters 21 in C in FIG. 25, and focal distance information using R pixel signals is obtained from the phase difference pixels 2A having R color filters 21 in C in FIG. 25.

Further, focal distance information using G pixel signals is obtained from the phase difference pixels 2A having G color filters 21 in D in FIG. 25, and focal distance information using R pixel signals is obtained from the phase difference pixels 2A having R color filters 21 in D in FIG. 25.

In a case where one OCL 221 is provided for two pixels as described above, the OCLs 221 are arranged in the pixel array unit 3 so that all conceivable combinations of directions of formation of the OCLs 221 and colors of the color filters 21 exist. In this manner, more accurate focal distance information can be obtained.

However, the eight types of combinations shown in A through D in FIG. 25 do not necessarily exist in the pixel array unit 3, as long as at least one of A through D in FIG. 25 exists in the pixel array unit 3.

It should be noted that the in-layer lenses 48 of two pixels for which one OCL 221 is provided are deviated away from the center position of the OCL 221, as in each of the above described embodiments. Also, the in-layer lenses 48 may have any of the shapes shown in FIG. 8.

<Second One of the Other Examples of OCLs>

Figure 26:
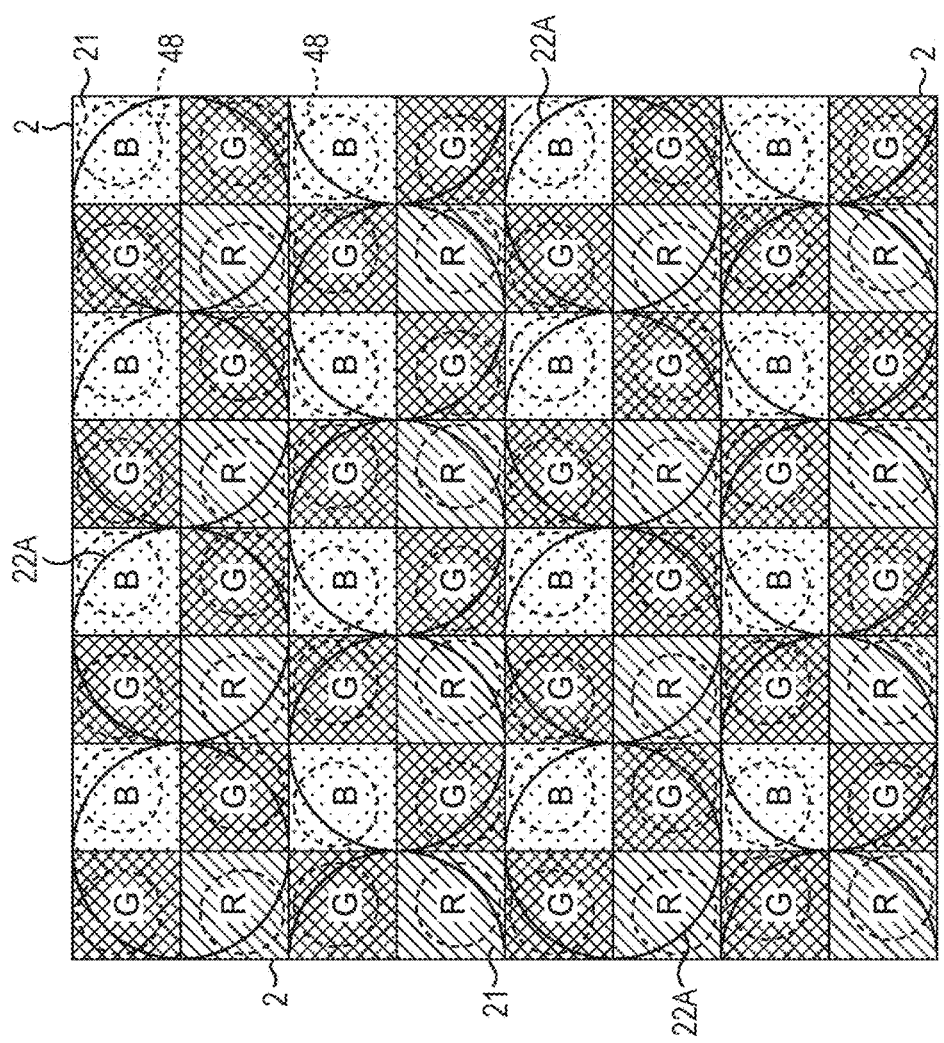
FIG. 26 shows a second one of the other examples of OCLs.

FIG. 26 shows a second one of the other examples of OCLs.

In the above described example, the phase difference pixels 2A with which focal distance information can be obtained are restricted to predetermined positions in the pixel array unit 3, as shown in FIG. 6.

However, OCLs 22A to be shared by four pixels may be provided for all the pixels 2 in the pixel array unit 3, as shown in FIG. 26. That is, all the pixels 2 of the pixel array unit 3 may be phase difference pixels 2A that share each OCL 22A among four pixels.

In the example shown in FIG. 26, the OCLs 22A are arranged so that the combinations of colors of color filters 21 shown in A and D in FIG. 7 are realized among the four types of combinations of colors of color filters 21 shown in A through D in FIG. 7. However, the OCLs 22A may also be arranged so that the combinations shown in B and C in FIG. 7 are realized, or the combinations shown in C and D in FIG. 7 are realized.

<Third One of the Other Examples of OCLs>

Figure 27:
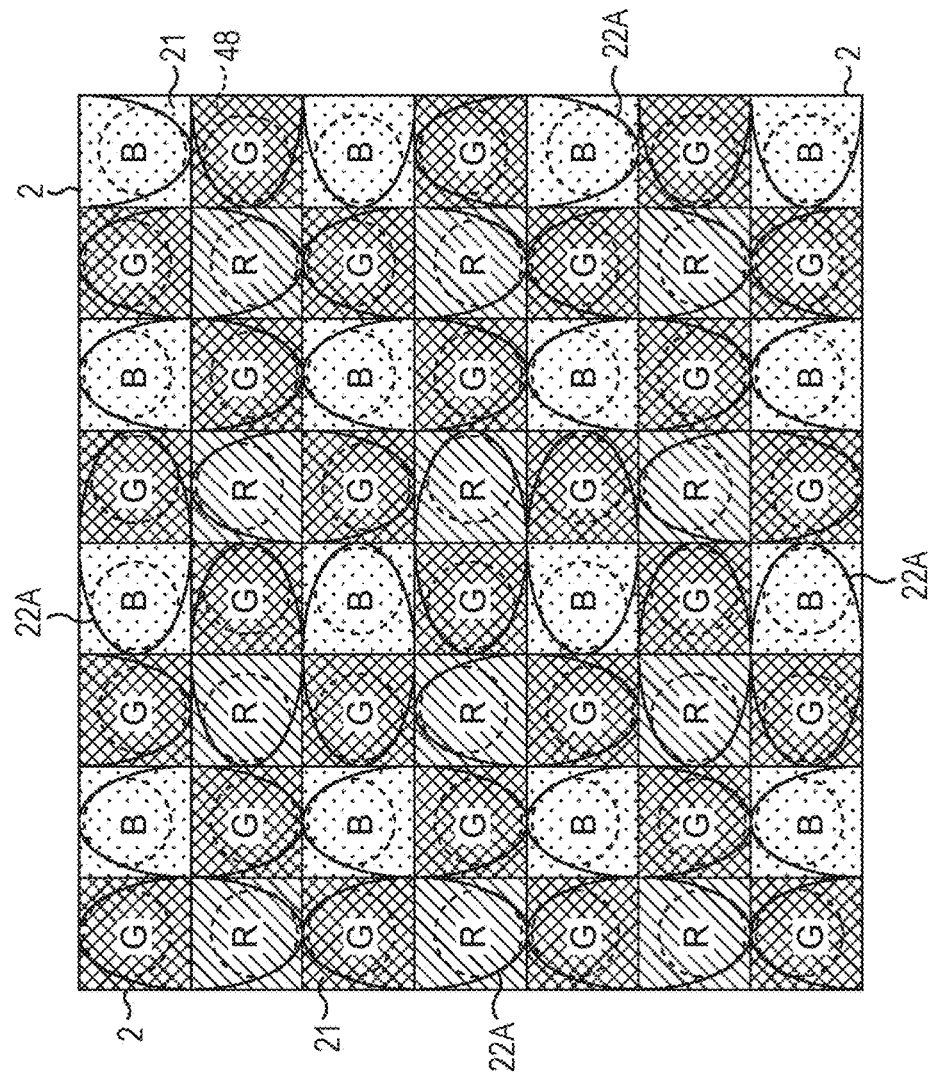
FIG. 27 shows a third one of the other examples of OCLs.

Alternatively, all the pixels 2 of the pixel array unit 3 may be phase difference pixels 2A that share each OCL 221 between two pixels, as shown in FIG. 27.

As the OCLs 22A or the OCLs 221 are provided for all the pixels of the pixel array unit 3 in the above manner, accurate focusing can be performed in any desired position in the pixel array unit 3.

<First One of Other Examples of Color Combinations Among Color Filters>

Figure 28:
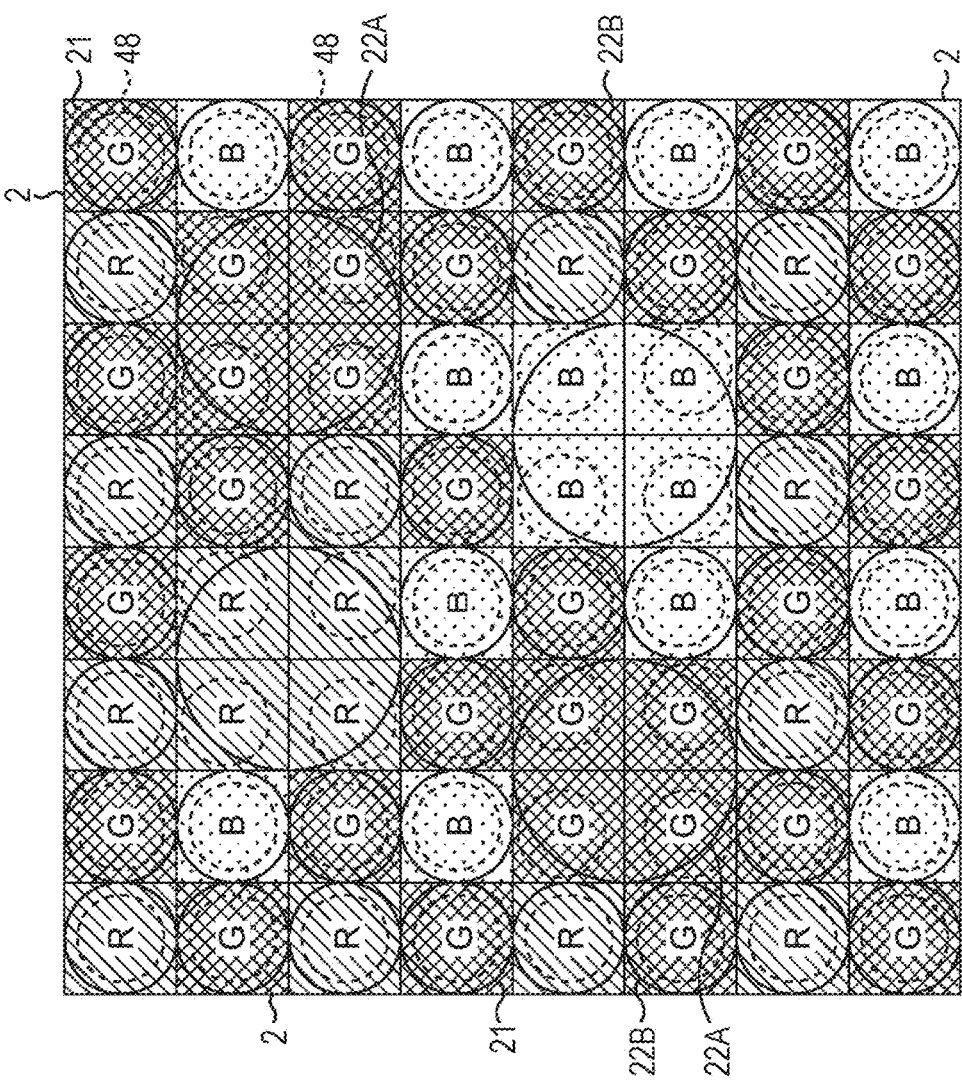
FIG. 28 is a diagram showing a first one of other examples of color combinations among color filters.
Figure 29:
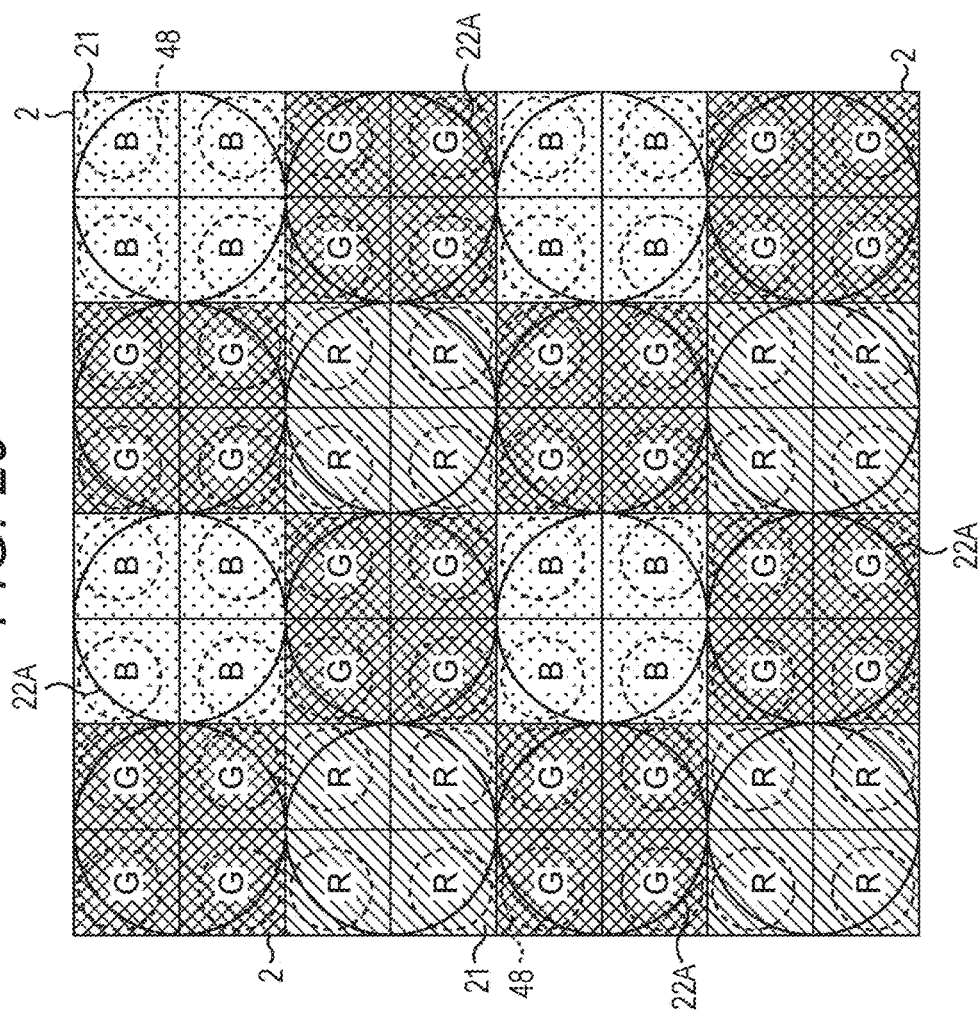
FIG. 29 is a diagram showing a second one of the other examples of color combinations among color filters.
Figure 30:
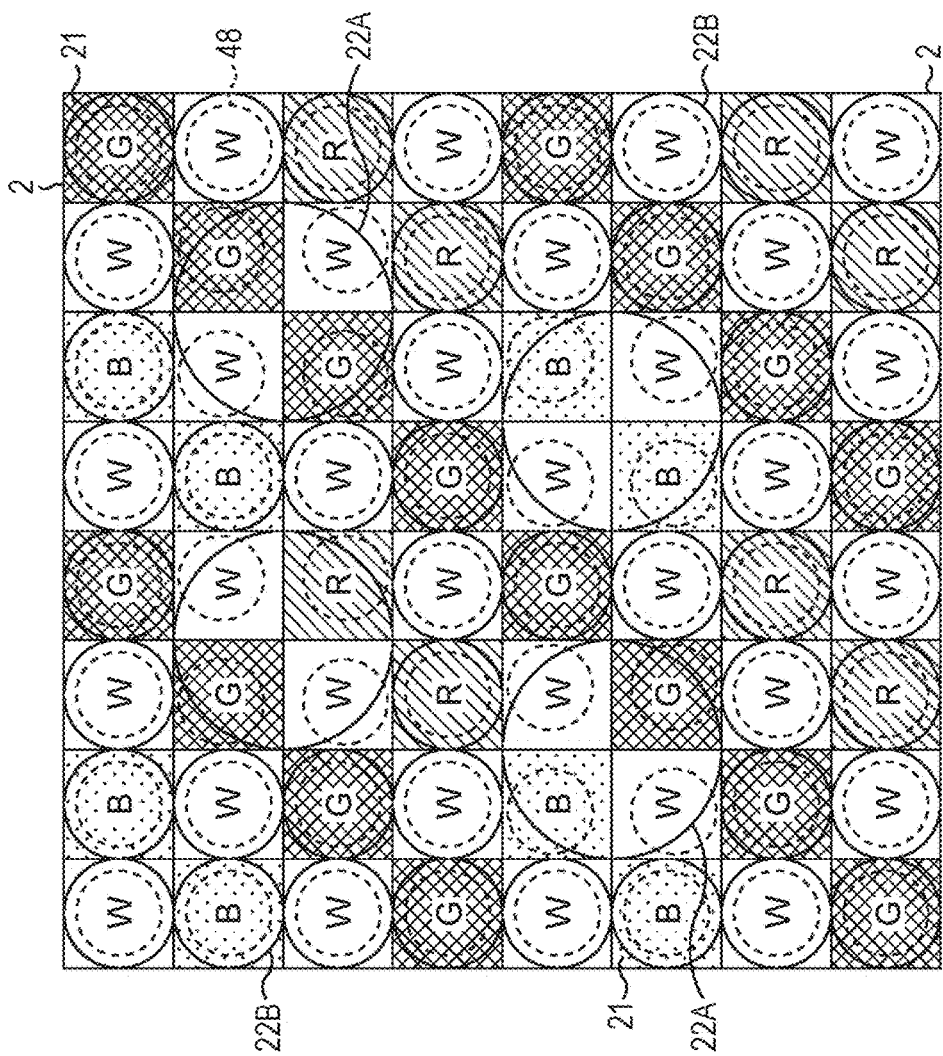
FIG. 30 is a diagram showing a third one of the other examples of color combinations among color filters.

FIGS. 28 through 30 show other examples of color combinations among color filters.

In each of the above embodiments, the color filters 21 are arranged in the Bayer pattern, regardless of whether the pixels 2 are the phase difference pixels 2A having OCLs 22A (or OCLs 221) formed thereon, or whether the pixels 2 are the normal pixels 2B. Therefore, each four pixels sharing one OCL 22A include color filters 21 of different colors, as shown in FIG. 6, for example.

However, as shown in FIG. 28, color combinations may be designed so that color filters 21 of a single color are formed in each four pixels sharing one OCL 22A, for example. With such color combinations, color mixing is prevented in each four pixels sharing one OCL 22A.

In the example shown in FIG. 28, the three colors of R, G, and B exist as the colors of the color filters 21 of sets of four pixels sharing one OCL 22A. However, the color filters 21 of the sets of four pixels sharing one OCL 22A may be only one of those colors.

Although not shown in the drawings, the color filters 21 of each set of two phase difference pixels 2A sharing one OCL 221 may also have the same color (a single color).

<Second One of the Other Examples of Color Combinations Among Color Filters>

Further, in a case where OCLs 22A or OCLs 221 are provided for all the pixels of the pixel array unit 3 as shown in FIGS. 26 and 27, the color filters 21 of R, G, and B may be arranged so that sets of 2×2 or four pixels are arranged in the Bayer pattern as shown in FIG. 29.

<Third One of the Other Examples of Color Combinations Among Color Filters>

In the above described example, the three colors of R, G, and B are arranged as the colors of the color filters 21 in a predetermined pattern (the Bayer pattern, for example). However, the colors of the color filters 21 may be a combination of colors other than the three colors of R, G, and B.

FIG. 30 shows an example where white (W) is added to R, G, and B as the colors of the color filters 21, and R, G, B, and W are arranged in a predetermined pattern. The pixels 2 having the color filters 21 of W are filters that pass light in all wavelength regions, and can receive light at a higher sensitivity than the pixels 2 having the color filters 21 of G.

In FIG. 30, the color filters 21 of W are arranged checkerwise, and the color filters 21 of R, G, and B are arranged in the remaining positions. However, arrangement of R, G, B, and W is not limited to that. For example, sets of 2×2 or four pixels consisting of a color filter 21 of R, a color filter 21 of G, a color filter 21 of B, and a color filter 21 of W may be repeatedly aligned in the vertical direction and the horizontal direction.

<Another Example of the Shape of OCLs>

Figure 31:
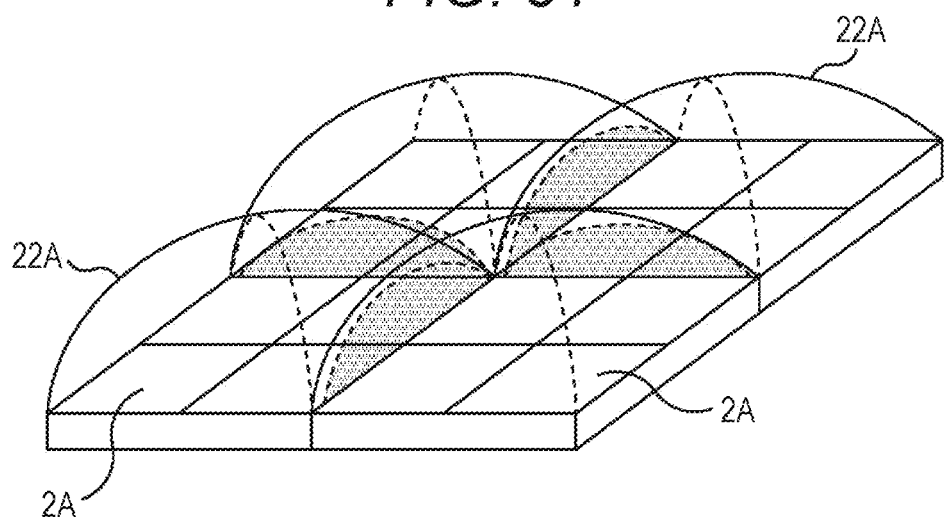
FIG. 31 is a perspective view of another example of the shape of OCLs.

FIG. 31 is a perspective view of another example of the shape of the OCLs 22A.

As can be seen from the top view in FIG. 2, the shape of each OCL 22A is a semispherical shape that does not cover the four corners of the set of the four pixels on which the OCL 22A is provided, and the bottom surface of the OCL 22A has a circular shape.

However, as shown in FIG. 31, each OCL 22A can have a convex square shape so that the inclined surface of the lens covers the four corners of the set of the four pixels on which the OCL 22A is provided, and the bottom surface of the OCL 22A has a square shape. With this shape, a larger amount of incident light can be captured, and sensitivity can be increased.

<10. Example Structure of a Back-Illuminated Type>

Although the solid-state imaging device 1 is a MOS solid-state imaging device of a surface-illuminated type in each of the above described embodiments, the present disclosure can also be applied to a MOS solid-state imaging device of a back-illuminated type.

Figure 32:
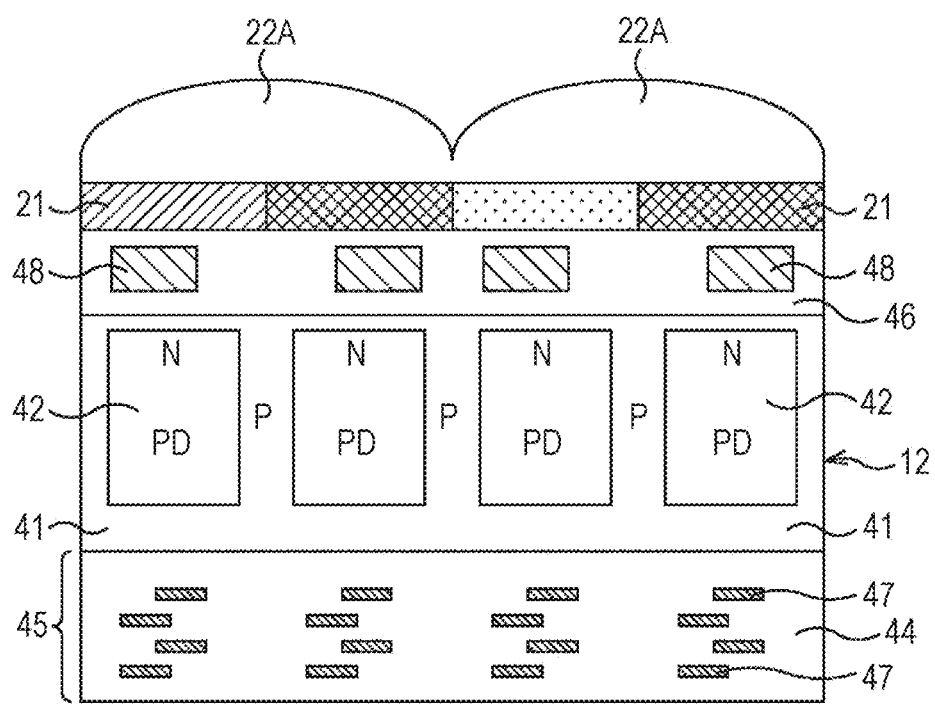
FIG. 32 is a cross-sectional structural view of phase difference pixels of a back-illuminated type.

FIG. 32 is a cross-sectional view of a structure in which phase difference pixels 2A according to the first embodiment are of a back-illuminated type.

In FIG. 32, the components equivalent to those shown in FIG. 3 are denoted by the same reference numerals used in FIG. 3, and explanation of them will not be unnecessarily repeated.

In the structure of the back-illuminated type, the lower side of the semiconductor substrate 12 in the drawing is the front surface, and multi-level interconnect layers 45 formed with interconnect layers 47 and an interlayer insulating film 44 is formed under the semiconductor substrate 12.

An insulating layer 46 having in-layer lenses 48 in some portions is formed on the back surface that is the upper side of the semiconductor substrate 12 in the drawing. Not having the interconnect layers 47 formed therein, the insulating layer 46 is thinner than that in the surface-illuminated structure shown in FIG. 3.

The other aspects are the same as those of the above described surface-illuminated structure.

In the above described structure of a back-illuminated type, the in-layer lenses 48 serving as the second lenses are deviated from the pixel centers in the directions away from the centers of the OCLs 22A. With this structure, the amounts of light entering the photodiodes PD of the respective phase difference pixels 2A can be increased, and color reproducibility degradation due to color mixing can be restrained. That is, photosensitivity becomes higher, and focus detection accuracy also becomes higher.

A structure of a back-illuminated type can also be employed in each of the embodiments other than the first embodiment.

<11. Example Structure of the Substrate of a Solid-State Imaging Device>

Figure 33:
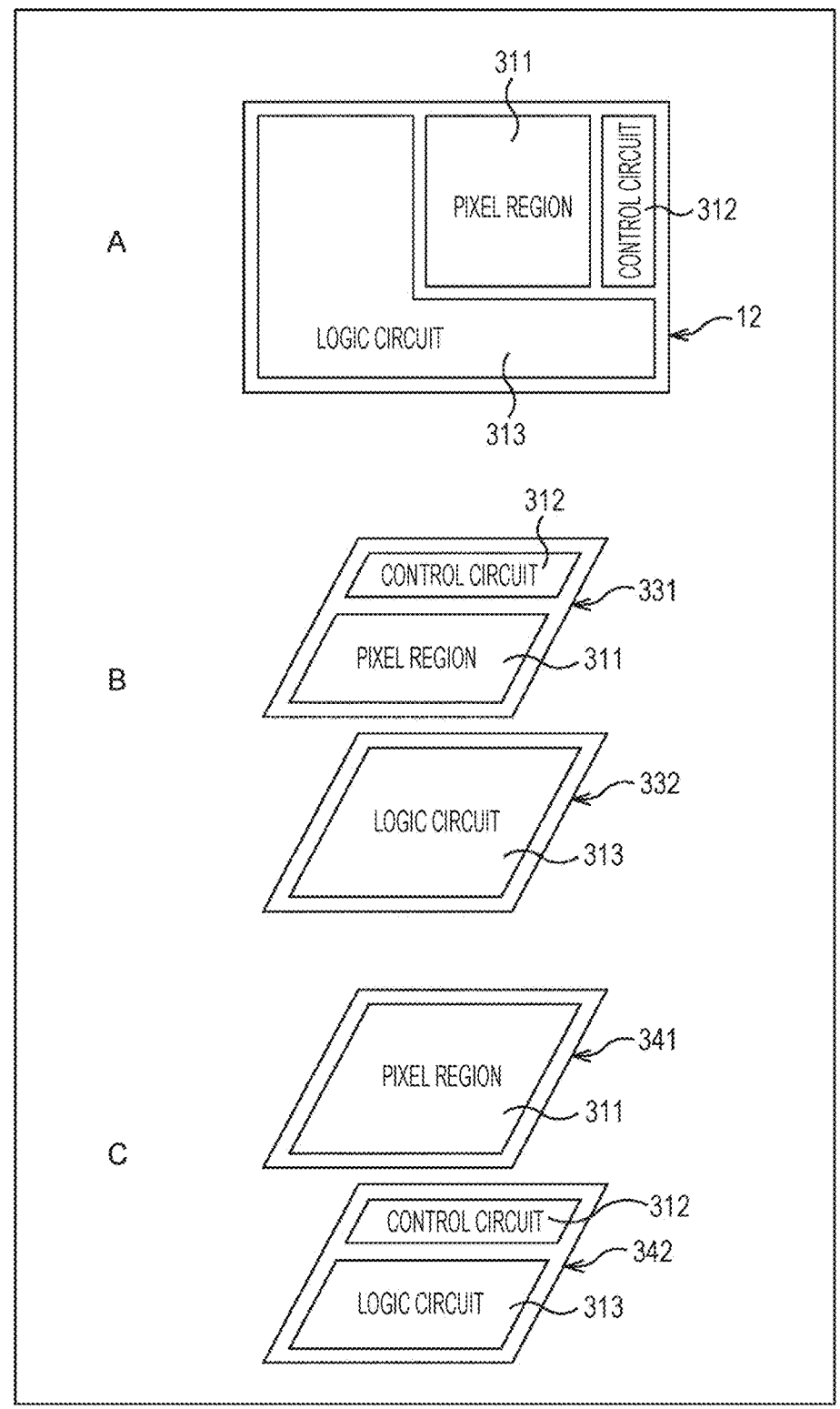
FIG. 33 is a diagram showing an example structure of the substrate of a solid-state imaging device.

As shown in A in FIG. 33, the solid-state imaging device 1 in FIG. 1 has a structure in which a pixel region 311 having the pixels 2 arranged therein, a control circuit 312 that controls the pixels 2, and a logic circuit 313 including the signal processing circuit for pixels signals are formed on the single semiconductor substrate 12.

However, as shown in B in FIG. 33, the solid-state imaging device 1 may have a structure in which a first semiconductor substrate 331 having the pixel region 311 and the control circuit 312 formed therein, and a second semiconductor substrate 332 having the logic circuit 313 formed therein are stacked. The first semiconductor substrate 331 and the second semiconductor substrate 332 are electrically connected by a through via or a Cu—Cu metallic bond, for example.

Alternatively, as shown in C in FIG. 33, the solid-state imaging device 1 may have a structure in which a first semiconductor substrate 341 having only the pixel region 311 formed therein, and a second semiconductor substrate 342 having the control circuit 312 and the logic circuit 313 formed therein are stacked. The first semiconductor substrate 341 and the second semiconductor substrate 342 are electrically connected by a through via or a Cu—Cu metallic bond, for example.

<12. Example Application to Electronic Apparatuses>

The above described solid-state imaging device 1 can be used in various kinds of electronic apparatuses, such as imaging apparatuses like digital still cameras and digital video cameras, portable telephone devices having imaging functions, and audio players having imaging functions.

Figure 34:
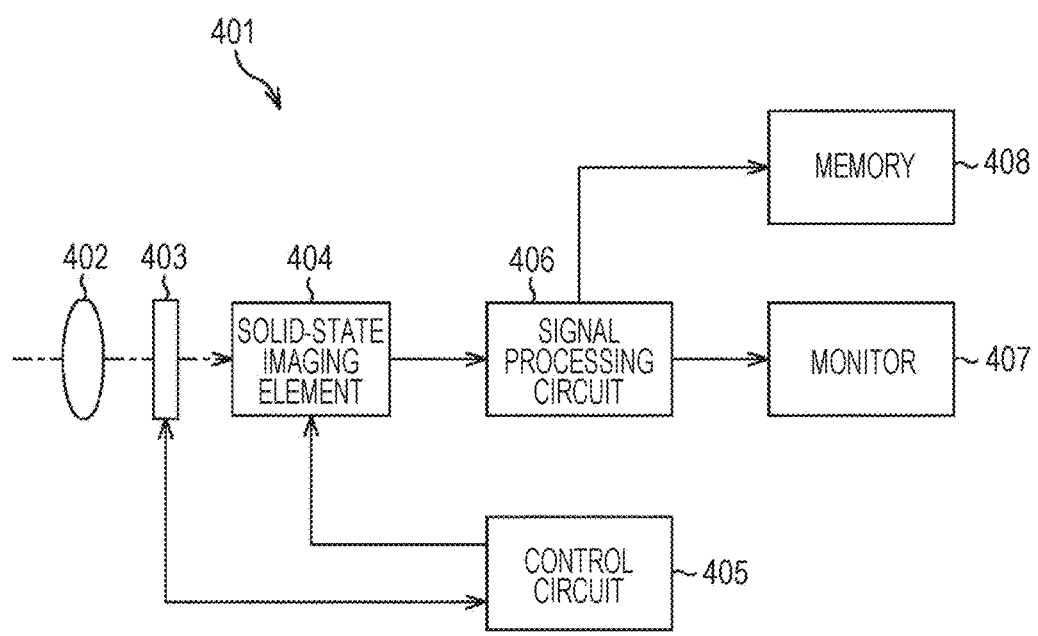
FIG. 34 is a block diagram showing an example structure of an imaging apparatus as an electronic apparatus according to the present disclosure.

FIG. 34 is a block diagram showing an example structure of an imaging apparatus as an electronic apparatus according to the present disclosure.

The imaging apparatus 401 shown in FIG. 34 includes an optical system 402, a shutter device 403, a solid-state imaging device 404, a control circuit 405, a signal processing circuit 406, a monitor 407, and a memory 408, and can take still images and moving images.

The optical system 402 includes one or more lenses to guide light (incident light) from an object to the solid-state imaging device 404, and form an image on the light receiving surface of the solid-state imaging device 404.

The shutter device 403 is placed between the optical system 402 and the solid-state imaging device 404, and, under the control of the control circuit 405, controls the light emission period and the light blocking period for the solid-state imaging device 404.

The solid-state imaging device 404 is formed with the above described solid-state imaging device 1. In accordance with light that is emitted to form an image on the light receiving surface via the optical system 402 and the shutter device 403, the solid-state imaging device 404 accumulates signal charges for a certain period of time. The signal charges accumulated in the solid-state imaging device 404 are transferred in accordance with a drive signal (timing signal) supplied from the control circuit 405. The solid-state imaging device 404 may be formed as a single chip, or may be formed as part of a camera module, being packaged together with the optical system 402 and the signal processing circuit 406.

The control circuit 405 outputs the drive signal that controls the transfer operation of the solid-state imaging device 404 and the shutter operation of the shutter device 403, to drive the solid-state imaging device 404 and the shutter device 403.

The signal processing circuit 406 performs various kinds of signal processing on pixel signals that are output from the solid-state imaging device 404. The image (image data) obtained through the signal processing performed by the signal processing circuit 406 is supplied to and displayed on the monitor 407, or is supplied to and stored (recorded) into the memory 408.

As the solid-state imaging device 1 having a pixel structure according to any of the above described embodiments is used as the solid-state imaging device 404 as described above, photosensitivity can be increased, and focus detection accuracy can also be increased. Accordingly, the quality of captured images can also be increased in the imaging apparatus 401, which is a video camera, a digital still camera, a camera module for mobile devices such as portable telephone devices, or the like.

The solid-state imaging device 1 according to any of the above described embodiments includes: a first semiconductor region (a semiconductor region 42) that stores charge in a first pixel (an R pixel, for example); a second semiconductor region (a semiconductor region 42) that stores charge in a second pixel (a G pixel, for example) adjacent to the first pixel; a first color filter (a color filter 21 of R) provided above the first semiconductor region; a second color filter (a color filter 21 of G) provided above the second semiconductor region; an on-chip lens (an OCL 22A) provided above the first color filter and the second color filter; a first lens (the in-layer lens 48 of the R pixel) provided between the first semiconductor region and the on-chip lens in the cross-sectional direction (the vertical direction in the cross-sectional structural view in FIG. 3 and the like); and a second lens (the in-layer lens 48 of the G pixel) provided between the second semiconductor region and the on-chip lens in the cross-sectional direction.

In the first embodiment, for example, the first lens (the in-layer lens 48 of the R pixel) is provided in the insulating layer 46 located between the first color filter (the color filter 21 of R) and the first semiconductor region (the semiconductor region 42), as shown in FIG. 3.

In the second embodiment, for example, the first lens (the in-layer lens 48 of the R pixel) is provided between the first color filter (the color filter 21 of R) and the on-chip lens (OCL 22A), as shown in FIG. 17.

Also, the center of the first lens (the in-layer lens 48 of the R pixel) is deviated from the center of the first color filter (the color filter 21 of R).

In the solid-state imaging devices in above described examples, the first conductivity type is the P-type, the second conductivity type is the N-type, and electrons are used as signal charges. However, the present disclosure can also be applied to solid-state imaging devices in which holes are used as signal charges. That is, the first conductivity type may be the N type, the second conductivity type may be the P type, and the conductivity types of the above described respective semiconductor regions may be reversed.

The present disclosure can be applied not only to solid-state imaging devices that sense an incident light quantity distribution of visible light and form an image based on the distribution, but also to solid-state imaging devices (physical quantity distribution sensors) in general, such as a solid-state imaging device that senses an incident quantity distribution of infrared rays, X-rays, particles, or the like, and forms an image based on the distribution, or a fingerprint sensor that senses a distribution of some other physical quantity in a broad sense, such as pressure or capacitance, and forms an image based on the distribution.

It should be noted that embodiments of the present disclosure are not limited to the above described embodiments, and various modifications may be made to the above embodiments without departing from the scope of the present disclosure.

For example, it is possible to employ a combination of all or some of the above described embodiments.

The advantageous effects described in this specification are merely examples, and the advantageous effects of the present disclosure are not limited to them and may include other effects.

The present disclosure may also be embodied in the structures described below.

(1)
A solid-state imaging device including
pixels sharing one on-chip lens,
the pixels each having an in-layer lens below the on-chip lens.

(2)
The solid-state imaging device of (1), wherein the in-layer lenses are arranged in planar positions deviated from the center positions of the pixels.

(3)
The solid-state imaging device of (1) or (2), wherein the in-layer lenses are deviated in a direction away from the center position of the on-chip lens.

(4)
The solid-state imaging device of any of (1) through (3), wherein the in-layer lenses are made of a material having a higher refractive index than the refractive index of the layer surrounding the in-layer lenses.

(5)
The solid-state imaging device of any of (1) through (4), wherein the gravity centers of the in-layer lenses are located in planar positions deviated from the center positions of the pixels.

(6)
The solid-state imaging device of (5), wherein, as the proportion of the material having the higher refractive index than the refractive index of the surrounding layer is made higher in the direction away from the center positions of the pixels, the gravity centers of the in-layer lenses are located in the planar positions deviated from the center positions of the pixels.

(7)
The solid-state imaging device of any of (4) through (6), wherein the in-layer lenses each have a ring-pattern shape formed with ring-shaped members having the higher refractive index, the ring-shaped members being provided outside a circular cylindrical shape.

(8)
The solid-state imaging device of any of (1) through (7), wherein the in-layer lenses are provided below or above color filters.

(9)
The solid-state imaging device of any of (1) through (8), wherein the in-layer lenses are connected to a protection film formed as a continuous film, and are made of the same material as the protection film.

(10)
The solid-state imaging device of any of (1) through (9), wherein the pixels have waveguides below the in-layer lenses.

(11)
The solid-state imaging device of any of (1) through (10), wherein the pixels have photodiodes below the waveguides.

(12)
The solid-state imaging device of any of (1) through (11), wherein the pixels have photoelectric conversion units outside a semiconductor substrate.

(13)
The solid-state imaging device of any of (1) through (12), wherein
the pixels have photoelectric conversion units, and
the photoelectric conversion units photoelectrically convert incident light of different wavelengths.

(14)
The solid-state imaging device of any of (1) through (13), wherein the on-chip lens and the in-layer lenses are arranged in positions where exit pupil correction is performed.

(15)
The solid-state imaging device of any of (1) through (14), wherein the one on-chip lens is shared between two pixels or among four pixels.

(16)
The solid-state imaging device of any of (1) through (15), wherein the pixels each have a color filter of R, G, or B.

(17)
The solid-state imaging device of any of (1) through (15), wherein the pixels each have a color filter of R, G, B, or W.

(18)
The solid-state imaging device of any of (1) through (17), including
a first pixel and a second pixel having the color filters of the same color, wherein
the inclination of the slope of the on-chip lens of the first pixel is the opposite of the inclination of the slope of the on-chip lens of the second pixel.

(19)

The solid-state imaging device of any of (1) through (18), wherein all pixels arranged in a two-dimensional array share each on-chip lens between pixels.

(20)

An electronic apparatus including a solid-state imaging device including pixels sharing one on-chip lens, the pixels each having an in-layer lens below the on-chip lens.

(21)

A solid-state imaging device including:

a first semiconductor region;

a second semiconductor region;

a first color filter provided above the first semiconductor region;

a second color filter provided above the second semiconductor region;

an on-chip lens provided above the first color filter and the second color filter;

a first lens provided between the first semiconductor region and the on-chip lens in a cross-sectional direction; and a second lens provided between the second semiconductor region and the on-chip lens in the cross-sectional direction.

(22)

The solid-state imaging device of (21), wherein the first lens is provided between the first color filter and the first semiconductor region in the cross-sectional direction.

(23)

The solid-state imaging device of (22), wherein the first lens is provided in an insulating layer.

(24)

The solid-state imaging device of (21), wherein the first lens is provided between the first color filter and the on-chip lens in the cross-sectional direction.

(25)

The solid-state imaging device of (21), wherein the center of the first lens is deviated from the center of the first color filter.

REFERENCE SIGNS LIST

1 Solid-state imaging device
2 Pixel
2A Phase difference pixel
2B Normal pixel
3 Pixel array unit
48 In-layer lens
151 Protection film
161 Waveguide
PD,PD1,PD2 Photodiode
181 Photoelectric conversion unit
401 Imaging apparatus
404 Solid-state imaging device

The invention claimed is:

1. A solid-state imaging device, comprising:
at least one on-chip lens; and
a plurality of pixels that share one on-chip lens of the at least one on-chip lens,
wherein each of the plurality of pixels has a respective in-layer lens of a plurality of in-layer lenses below the one on-chip lens, and
wherein the plurality of in-layer lenses are in planar positions deviated from center positions of the plurality of pixels.

2. The solid-state imaging device according to claim 1, wherein the plurality of in-layer lenses are deviated in a direction away from a center position of the on-chip lens.

3. The solid-state imaging device according to claim 1, wherein the plurality of in-layer lenses are made of a material having a first refractive index higher than a second refractive index of a layer that surrounds the plurality of in-layer lenses.

4. The solid-state imaging device according to claim 3, wherein gravity centers of the plurality of in-layer lenses are in the planar positions deviated from center positions of the plurality of pixels.

5. The solid-state imaging device according to claim 4, wherein based on a proportion of the material that is higher in a direction away from the center positions of the plurality of pixels, the gravity centers of the plurality of in-layer lenses are in the planar positions deviated from the center positions of the plurality of pixels.

6. The solid-state imaging device according to claim 3, wherein a shape of each of the in-layer lenses is a ring-pattern shape that comprises ring-shaped members having the first refractive index, wherein the ring-shaped members are outside a circular cylindrical shape.

7. The solid-state imaging device according to claim 1, wherein the plurality of in-layer lenses are one of below or above a color filter.

8. The solid-state imaging device according to claim 1, wherein the plurality of in-layer lenses are connected to a protection film, wherein the protection film is a continuous film, and wherein each of the plurality of in-layer lenses comprises a same material as the protection film.

9. The solid-state imaging device according to claim 1, wherein the plurality of pixels have waveguides below the plurality of in-layer lenses.

10. The solid-state imaging device according to claim 9, wherein the plurality of pixels have photodiodes below the waveguides.

11. The solid-state imaging device according to claim 1, wherein the plurality of pixels have a photoelectric conversion unit outside a semiconductor substrate.

12. The solid-state imaging device according to claim 1, wherein
the plurality of pixels have a plurality of photoelectric conversion units, and
the plurality of photoelectric conversion units photoelectrically convert incident light of different wavelengths.

13. The solid-state imaging device according to claim 1, wherein the on-chip lens and the plurality of in-layer lenses are in specific positions where exit pupil is corrected.

14. The solid-state imaging device according to claim 1, wherein the one on-chip lens is shared between two pixels of the plurality of pixels or among four pixels of the plurality of pixels.

15. The solid-state imaging device according to claim 1, wherein each of the plurality of pixels comprises a color filter of one of R, G, or B.

16. The solid-state imaging device according to claim 1, wherein each of the plurality of pixels comprises a color filter of one of R, G, B, or W.

17. The solid-state imaging device according to claim 1, wherein the plurality of pixels include a first pixel and a second pixel, wherein both of the first pixel and the second pixel comprise color filters of a same color, and
wherein an inclination of a first slope of the on-chip lens corresponding to the first pixel is opposite to an inclination of a second slope of the on-chip lens corresponding to the second pixel.

18. The solid-state imaging device according to claim 1, wherein the plurality of pixels are in a two-dimensional array.

19. An electronic apparatus, comprising:
a solid-state imaging device including:
at least one on-chip lens; and
a plurality of pixels that share one on-chip lens of the at least one on-chip lens,
wherein each of the plurality of pixels has a respective in-layer lens of a plurality of in-layer lenses below the one on-chip lens, and
wherein the plurality of in-layer lenses are in planar positions deviated from center positions of the plurality of pixels.

20. A solid-state imaging device, comprising:
a first semiconductor region;
a second semiconductor region;
a first color filter above the first semiconductor region;
a second color filter above the second semiconductor region;
an on-chip lens above each of the first color filter and the second color filter;
a first lens between the first semiconductor region and the on-chip lens in a cross-sectional direction,
wherein a center of the first lens is deviated from a center of the first semiconductor region; and
a second lens between the second semiconductor region and the on-chip lens in the cross-sectional direction,
wherein a center of the second lens is deviated from a center of the second semiconductor region.

21. The solid-state imaging device according to claim 20, wherein the first lens is between the first color filter and the first semiconductor region in the cross-sectional direction.

22. The solid-state imaging device according to claim 21, wherein the first lens is in an insulating layer.

23. The solid-state imaging device according to claim 20, wherein the first lens is between the first color filter and the on-chip lens in the cross-sectional direction.

24. The solid-state imaging device according to claim 20, wherein the center of the first lens is deviated from a center of the first color filter.

* * * * *